United States Patent
Shirata et al.

(10) Patent No.: US 9,025,126 B2
(45) Date of Patent: May 5, 2015

(54) EXPOSURE APPARATUS ADJUSTING METHOD, EXPOSURE APPARATUS, AND DEVICE FABRICATING METHOD

(75) Inventors: Yosuke Shirata, Saitama (JP); Yoshiki Kida, Kounosu (JP)

(73) Assignee: Nikon Corporation, Tokyo (JP)

( * ) Notice: Subject to any disclaimer, the term of this patent is extended or adjusted under 35 U.S.C. 154(b) by 1308 days.

(21) Appl. No.: 12/219,755

(22) Filed: Jul. 28, 2008

(65) Prior Publication Data

US 2009/0279059 A1  Nov. 12, 2009

(30) Foreign Application Priority Data

Jul. 31, 2007   (JP) ................................. 2007-198675

(51) Int. Cl.
  *G03F 7/20* (2006.01)
(52) U.S. Cl.
  CPC ........ *G03F 7/70858* (2013.01); *G03F 7/70341* (2013.01); *G03F 7/707* (2013.01); *G03F 7/7075* (2013.01); *G03F 7/7085* (2013.01)
(58) Field of Classification Search
  CPC . G03F 7/7075; G03F 77/707; G03F 7/70341; G03F 7/70858; G03F 7/7085; G03F 7/70783; G03F 7/70875
  USPC ........ 355/30, 52, 53, 55, 72–74, 77; 430/5, 8, 430/22, 30, 311; 250/492.1, 492.2, 492.22, 250/548
  See application file for complete search history.

(56) References Cited

U.S. PATENT DOCUMENTS

| 4,503,335 | A | * | 3/1985 | Takahashi ..................... 250/548 |
| 4,666,273 | A | | 5/1987 | Shimizu et al. |
| 5,738,165 | A | | 4/1998 | Imai |
| 5,825,043 | A | | 10/1998 | Suwa |
| 6,208,407 | B1 | | 3/2001 | Loopstra |
| 6,228,544 | B1 | * | 5/2001 | Ota ................................. 430/30 |
| 6,235,438 | B1 | | 5/2001 | Suzuki et al. |
| 6,262,796 | B1 | | 7/2001 | Loopstra et al. |
| 6,319,322 | B1 | * | 11/2001 | Ueda et al. .................... 118/666 |
| 6,341,007 | B1 | | 1/2002 | Nishi et al. |

(Continued)

FOREIGN PATENT DOCUMENTS

| CN | 1746775 A | 3/2006 |
| CN | 1795535 A | 6/2006 |

(Continued)

OTHER PUBLICATIONS

Aug. 26, 2008 International Search Report issued in Application No. PCT/JP2008/063569 (with English translation).

(Continued)

*Primary Examiner* — Christina Riddle
(74) *Attorney, Agent, or Firm* — Oliff PLC

(57) ABSTRACT

An adjusting method that adjusts an immersion exposure apparatus that comprises a first holder, which holds a substrate, and a second holder, which holds the substrate before the substrate is held by the first holder, and that exposes the substrate, which is held by the first holder, through a liquid. The adjusting method comprises: holding a thermometer with the first holder; holding the thermometer with the second holder; and adjusting the temperature of at least one of the first holder and the second holder based on the detection result of the thermometer held by the first holder and the detection result of the thermometer held by the second holder.

34 Claims, 11 Drawing Sheets

(56) References Cited

U.S. PATENT DOCUMENTS

| | | | |
|---|---|---|---|
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,691,068 | B1 * | 2/2004 | Freed et al. ............... 702/187 |
| 6,778,257 | B2 | 8/2004 | Bleeker et al. |
| 6,897,963 | B1 | 5/2005 | Taniguchi et al. |
| 7,023,610 | B2 | 4/2006 | Ohtsuki et al. |
| 7,304,715 | B2 | 12/2007 | Cadee et al. |
| 7,483,117 | B2 | 1/2009 | Hirukawa |
| 8,064,044 | B2 | 11/2011 | Nagasaka |
| 8,243,254 | B2 | 8/2012 | Shirata |
| 2002/0041377 | A1 | 4/2002 | Hagiwara et al. |
| 2003/0226951 | A1 * | 12/2003 | Ye et al. .............. 250/208.1 |
| 2005/0046813 | A1 | 3/2005 | Streefkerk et al. |
| 2005/0078286 | A1 | 4/2005 | Dierichs et al. |
| 2005/0146693 | A1 * | 7/2005 | Ohsaki ...................... 355/30 |
| 2005/0146694 | A1 | 7/2005 | Tokita |
| 2005/0146695 | A1 | 7/2005 | Kawakami |
| 2005/0206850 | A1 | 9/2005 | Shimizu et al. |
| 2005/0264780 | A1 | 12/2005 | Graeupner |
| 2005/0288893 | A1 * | 12/2005 | Gassner .................. 702/182 |
| 2006/0007415 | A1 | 1/2006 | Kosugi et al. |
| 2006/0033892 | A1 | 2/2006 | Cadee et al. |
| 2006/0033898 | A1 * | 2/2006 | Cadee et al. ............... 355/53 |
| 2006/0082744 | A1 * | 4/2006 | Hirukawa ................. 355/30 |
| 2006/0087637 | A1 | 4/2006 | Ottens et al. |
| 2006/0098179 | A1 | 5/2006 | Hirukawa |
| 2007/0070324 | A1 | 3/2007 | Kuit et al. |
| 2007/0097341 | A1 | 5/2007 | Hikima |
| 2007/0146663 | A1 | 6/2007 | Nagasaka |
| 2007/0242248 | A1 * | 10/2007 | Nakano et al. ............ 355/53 |
| 2008/0106707 | A1 * | 5/2008 | Kobayashi et al. ......... 355/30 |
| 2008/0278695 | A1 * | 11/2008 | Shirata .................... 355/30 |

FOREIGN PATENT DOCUMENTS

| | | | | |
|---|---|---|---|---|
| EP | 1 628 330 | A1 | 2/2006 | |
| EP | 1 713 113 | A1 | 10/2006 | |
| EP | 1 783 821 | A1 | 5/2007 | |
| EP | 1 965 414 | A1 | 9/2008 | |
| JP | A-2005-012201 | | 1/2005 | |
| JP | A-2005-197384 | | 7/2005 | |
| JP | WO2006/101120 | A1 | 9/2006 | |
| JP | A-2006-339303 | | 12/2006 | |
| TW | 200534049 | A | 1/2007 | |
| TW | 200725195 | A | 7/2007 | |
| WO | WO 01/35168 | A1 | 5/2001 | |
| WO | WO 03/079418 | A1 | 9/2003 | |
| WO | WO 2004/019128 | A2 | 3/2004 | |
| WO | WO 2005076324 | A1 * | 8/2005 | ............ H01L 21/027 |
| WO | WO 2005/122218 | A1 | 12/2005 | |
| WO | WO2006/101120 | A1 | 9/2006 | |
| WO | WO 2007/066692 | A1 | 6/2007 | |

OTHER PUBLICATIONS

Aug. 26, 2008 Written Opinion issued in Application No. PCT/JP2008/063569 (with English translation).

Jun. 20, 2014 Office Action issued in Korean Patent Application No. 2009-7025305 (with translation).

Dec. 25, 2013 Office Action issued in Taiwanese Patent Application No. 097128966 (with translation).

Feb. 25, 2014 Office Action issued in Japanese Patent Application No. 2013-143539 (with translation).

Mar. 5, 2015 Office Action issued in Korean Application No. 2009-7025305.

* cited by examiner

FIG. 2
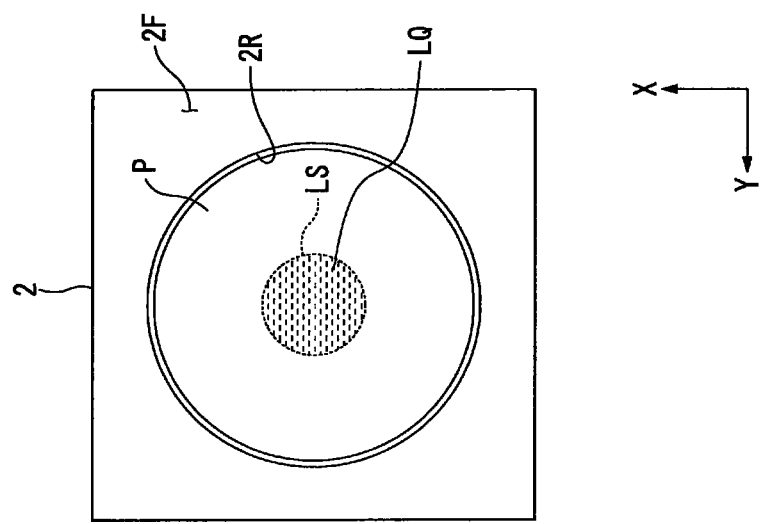
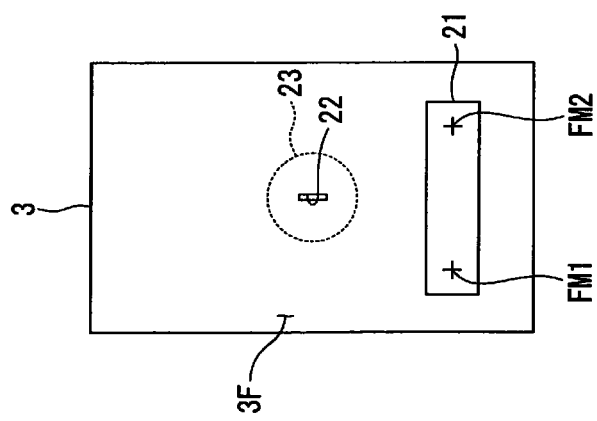

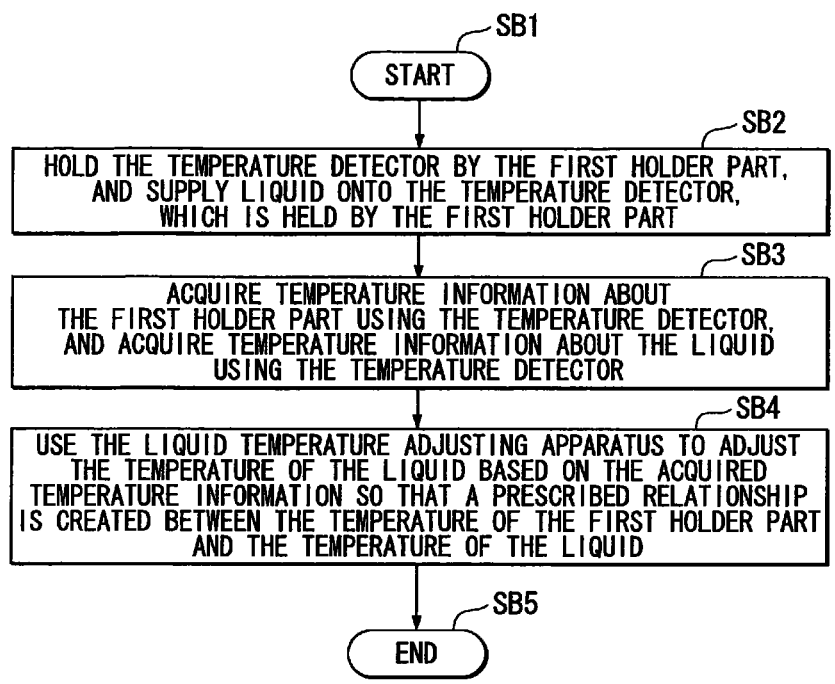
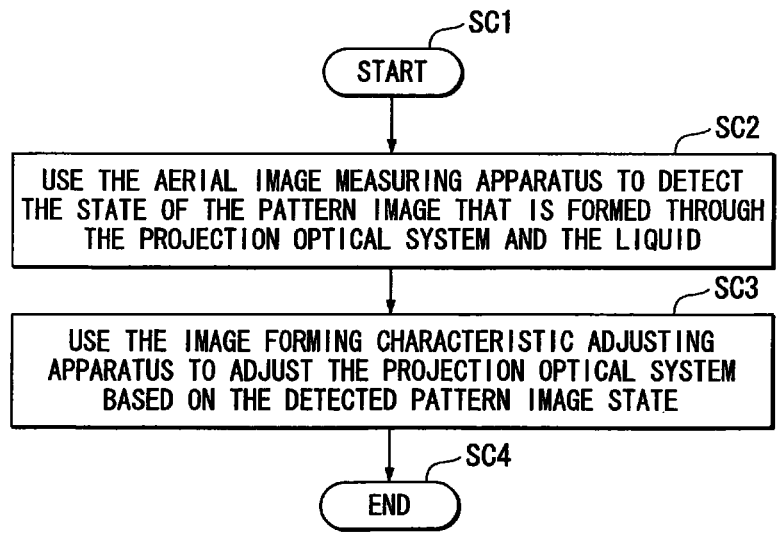

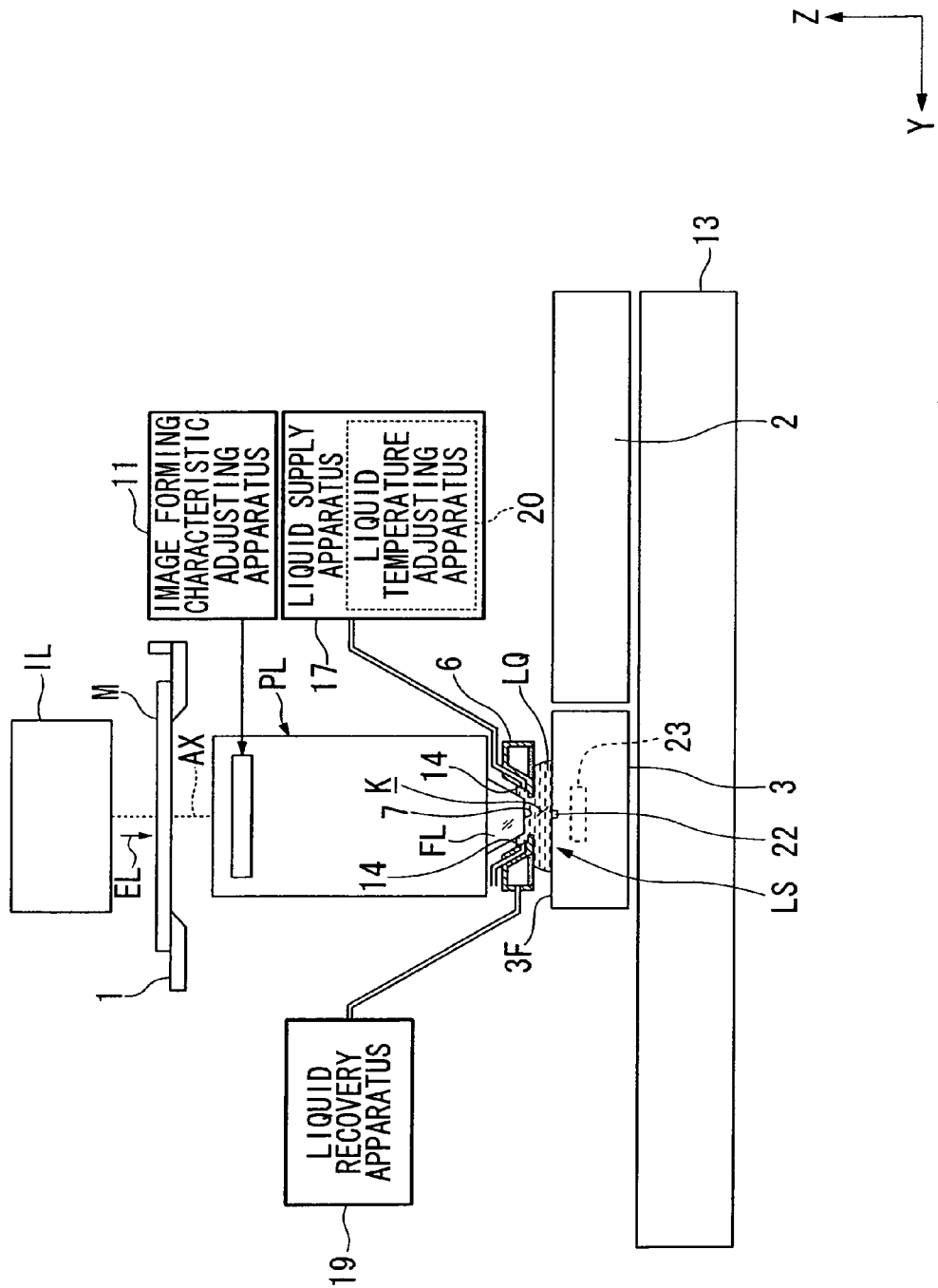

EXPOSURE APPARATUS ADJUSTING METHOD, EXPOSURE APPARATUS, AND DEVICE FABRICATING METHOD

CROSS-REFERENCE TO RELATED APPLICATION

This application claims priority to Japanese Patent Application No. 2007-198675, filed Jul. 31, 2007, the contents of which are incorporated herein by reference.

BACKGROUND

1. Field of the Invention

The present invention relates to an exposure apparatus adjusting method, an exposure apparatus, and a device fabricating method.

2. Related Art

Among exposure apparatuses used in photolithography, an immersion exposure apparatus is known that exposes a substrate through a liquid, as disclosed in, for example, Japanese Unexamined Patent Application Publication No. 2005-12201.

The exposure apparatus comprises a holding part that holds the substrate, which is irradiated by exposure light. Regarding the exposure apparatus, there may be a problem with the relationship between the temperature of the holding part and the temperature of the substrate. In addition, in the immersion exposure apparatus, there may be a problem with the relationship between the temperature of the substrate and the temperature of the liquid.

A purpose of some aspects of the present invention is to provide a method of adjusting an exposure apparatus in order to perform an exposure operation satisfactorily. Another purpose is to provide the exposure apparatus that can perform the exposure operation satisfactorily and a device fabricating method that uses the exposure apparatus.

SUMMARY

A first aspect of the invention provides a method of adjusting an immersion exposure apparatus that comprises a first holding part, which holds a substrate, and a second holding part, which holds the substrate before the substrate is held by the first holding part, and that exposes the substrate, which is held by the first holding part, through a liquid, and that comprises: holding a temperature detector with the first holding part; holding the temperature detector with the second holding part; and adjusting the temperature of at least one of the first holding part and the second holding part based on the detection result of the temperature detector held by the first holding part and the detection result of the temperature detector held by the second holding part.

A second aspect of the invention provides a method of adjusting an immersion exposure apparatus that comprises a holding part, which holds a substrate, and that exposes the substrate, which is held by the holding part, through a liquid, and that comprises: using a temperature detector, which is held by the holding part, to acquire a first information regarding the temperature of the holding part; using the temperature detector to acquire a second information regarding the temperature of the liquid that is supplied onto the temperature detector; and adjusting the temperature of at least one of the holding part and the liquid based on the first information and the second information.

A third aspect of the invention provides a device fabricating method, comprising: exposing the substrate using an immersion exposure apparatus that has been adjusted using the adjusting method according to the abovementioned aspects; and developing the exposed substrate.

A fourth aspect of the invention provides an exposure apparatus that exposes a substrate with exposure light through a liquid, comprising: a first holding part, which is capable of holding the substrate at a position at which it is irradiated by the exposure light; a second holding part, which holds the substrate before it is held by the first holding part and adjusts the temperature of the substrate; a transport apparatus, which transports the temperature detector held by the second holding part from the second holding part to the first holding part; and an adjusting apparatus, which adjusts the temperature of at least one of the first holding part and the second holding part based on the detection result of the temperature detector held by the first holding part and a detection result of the temperature detector held by the second holding part.

A fifth aspect of the invention provides an exposure apparatus that exposes a substrate with exposure light through a liquid, comprising: a holding part that is capable of holding the substrate at a position at which it is irradiated by the exposure light; a supply port wherethrough the liquid is supplied; and an adjusting apparatus that adjusts the temperature of at least one of the holding part and the liquid; wherein, by the supplying of the liquid via the supply port onto a temperature detector held by the holding part, the adjusting apparatus adjusts the temperature of at least one of the holding part and the liquid based on temperature information about the holding part and the liquid acquired by the temperature detector.

A sixth aspect of the invention provides a device fabricating method, comprising: exposing the substrate using an exposure apparatus according to the abovementioned aspects; and developing the exposed substrate.

According to the aspects of the present invention, a desired exposure operation can be performed. In addition, according to the aspects of the present invention, a desired device can be fabricated.

BRIEF DESCRIPTION OF THE DRAWINGS

FIG. 2 is a plan view of the substrate stage and the measurement stage, viewed from above.

FIG. 4 is a flow chart for explaining the adjusting method according to the first embodiment.

FIG. 5 is a flow chart for explaining the adjusting method according to the first embodiment.

FIG. 9 is a schematic view for explaining the adjusting method according to the first embodiment.

DESCRIPTION OF EMBODIMENTS

The following explains the embodiments of the present invention referencing the drawings, but the present invention is not limited thereto. Furthermore, the following explanation defines an XYZ orthogonal coordinate system, and the positional relationships among members are explained referencing this system. Furthermore, prescribed directions within the horizontal plane are the X axial directions, directions that are orthogonal to the X axial directions in the horizontal plane are the Y axial directions, and directions that are orthogonal to the X axial directions and the Y axial directions (i.e., the vertical directions) are the Z axial directions. In addition, the rotational directions around the X, Y, and Z axes (i.e., the inclined directions) are the θX, θY, and θZ directions, respectively.

First Embodiment

Figure 1:
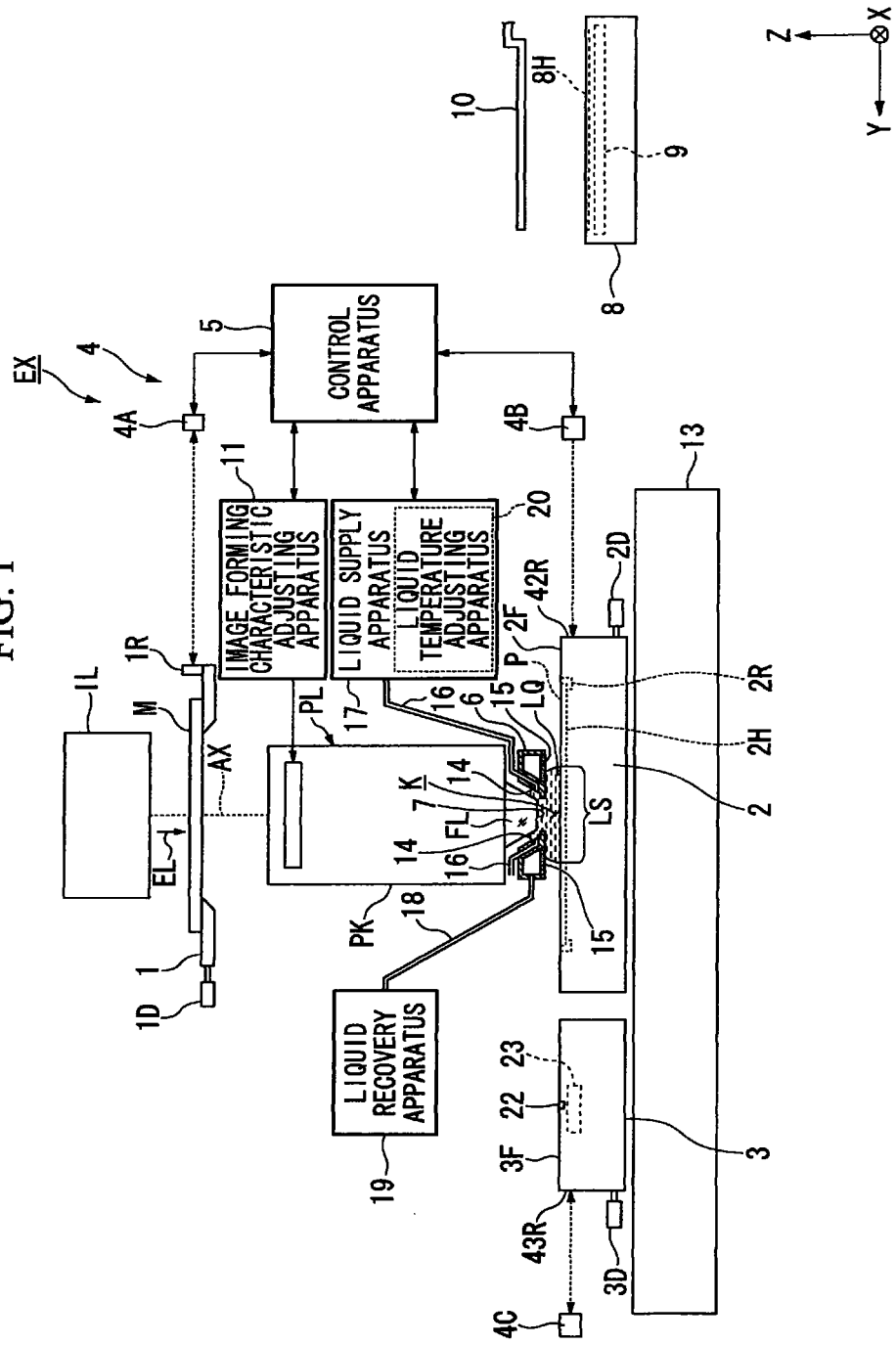
FIG. 1 is a schematic block diagram that shows one example of an exposure apparatus according to a first embodiment.

A first embodiment will now be explained. FIG. 1 is a schematic block diagram that shows an exposure apparatus EX according to the first embodiment. The present embodiment explains an exemplary case wherein the exposure apparatus EX is an exposure apparatus that comprises a substrate stage, which holds a substrate P, and a measurement stage, whereon a measuring instrument (including a measuring member) that is capable of performing exposure-related measurements is mounted. Furthermore, the exposure apparatus that comprises the substrate stage and the measurement stage is disclosed in, for example, U.S. Pat. No. 6,897,963.

In FIG. 1, the exposure apparatus EX comprises: a mask stage 1, which is capable of moving while holding a mask M; a substrate stage 2 that comprises a holder part 2H, which holds the substrate P, and is capable of moving while holding the substrate P with the holder part 2H; a measurement stage 3, whereon exposure-related measuring instruments are mounted, that is capable of moving independently of the substrate stage 2 without holding the substrate; an interferometer system 4, which comprises laser interferometers capable of measuring the position of each of the stages 1, 2, 3; an illumination system IL, which uses exposure light EL to illuminate the mask M, which is held by the mask stage 1; a projection optical system PL that projects an image of a pattern of the mask M, which is illuminated with the exposure light EL onto the substrate P; a transport apparatus 10, which transports the substrate P to the substrate stage 2; and a control apparatus 5 that controls the operation of the entire exposure apparatus EX.

Furthermore, the substrate P described herein includes a substrate wherein a photosensitive material (photoresist) is coated on a base material, for example, a semiconductor wafer. The mask M includes a reticle wherein a device pattern is formed that is projected onto the substrate P. In addition, a transmitting type mask is used as the mask in the present embodiment, but a reflection type mask may also be used.

The exposure apparatus EX of the present embodiment is an immersion exposure apparatus that exposes the substrate P by irradiating the substrate P with the exposure light EL through a liquid LQ, and comprises a nozzle member 6 for filling an optical path space K of the exposure light EL with the liquid LQ. In the present embodiment, water (pure water) is used as the liquid LQ.

The nozzle member 6 of the present embodiment is disposed in the vicinity of a last optical element FL, which is the optical element, among the plurality of optical elements of the projection optical system PL, that is closest to the image plane of the projection optical system PL. An immersion space LS is formed by holding the liquid LQ between the nozzle member 6 and an object so that the optical path space K of the exposure light EL, which lies between a lower surface (emergent surface) 7 of the last optical element FL and a front surface of the object, which opposes the lower surface 7 of the last optical element FL, is filled with the liquid LQ. The objects capable of opposing the nozzle member 6 and the lower surface 7 of the last optical element FL include objects capable of moving to a position at which they are irradiated with the exposure light EL from the last optical element FL. In the present embodiment, the objects capable of moving to positions at which they are irradiated with the exposure light EL include the substrate P, the substrate stage 2, and the measurement stage 3. The immersion space LS is formed between the nozzle member 6 and the lower surface 7 of the last optical element FL on one side and the front surface of the substrate P on the other side when the substrate P is exposed. While the front surface of the substrate P is irradiated with the exposure light EL, the liquid LQ in the immersion space LS contacts the front surface of the substrate P.

In the present embodiment, the immersion space LS is formed so that part of the area (a local area) of the front surface of the substrate P is covered with the liquid LQ during the exposure of the substrate P. Namely, the exposure apparatus EX of the present embodiment adopts a local liquid immersion system wherein the immersion space LS is formed so that the part of the area of the front surface of the substrate P that includes a projection area of the projection optical system PL is covered with the liquid LQ during the exposure of the substrate P.

The exposure apparatus EX of the present embodiment is a scanning type exposure apparatus (a so-called scanning stepper) that projects the image of the pattern of the mask M onto the substrate P while synchronously moving the mask M and the substrate P in prescribed scanning directions. In the present embodiment, the scanning directions (the synchronous movement directions) of the substrate P and of the mask M are the Y axial directions. The exposure apparatus EX moves the substrate P in the Y axial directions with respect to the projection area of the projection optical system PL and radiates the exposure light EL to the substrate P through the projection optical system PL and the liquid LQ while synchronously moving, according to the movement of the substrate P in the Y axial directions, the mask M in the Y axial directions with respect to the illumination area of the illumination system IL. In this manner, the image of the pattern of the mask M is projected onto the substrate P, which is thereby exposed by the exposure light EL.

In addition, in the present embodiment, the exposure apparatus EX comprises a holding member 8, which holds the substrate P before it is held by the substrate stage 2. The holding member 8 comprises a holder part 8H, which detachably holds the substrate P. The holder part 8H has a holding surface capable of opposing the rear surface of the substrate P. In addition, the exposure apparatus EX comprises a substrate temperature adjusting apparatus 9, which adjusts the temperature of the substrate P while it is held by the holder part 8H. At least part of the substrate temperature adjusting apparatus 9 is disposed in the holding member 8. The control apparatus 5 controls the substrate temperature adjusting apparatus 9.

In the present embodiment, the holding member 8 is disposed along the transport pathway of the transport apparatus 10. The transport apparatus 10 transports the substrate P to the holding member 8 before it is transported to the substrate stage 2. In addition, the transport apparatus 10 unloads the substrate P, which is held by the holding member 8, from the holding member 8. The transport apparatus 10 then transports the substrate P, which was unloaded from the holder part 8H of the holding member 8, to the holder part 2H of the substrate stage 2.

The illumination system IL illuminates a prescribed illumination region on the mask M with the exposure light EL, which has a uniform luminous flux intensity distribution. Examples of light that can be used as the exposure light EL emitted from the illumination system IL include: deep ultraviolet (DUV) light such as a bright line (g-line, h-line, or i-line) light emitted from, for example, a mercury lamp and KrF excimer laser light (with a wavelength of 248 nm); and vacuum ultraviolet (VUV) light such as ArF excimer laser light (with a wavelength of 193 nm) and $F_2$ laser light (with a wavelength of 157 nm). ArF excimer laser light is used as the exposure light EL in the present embodiment.

The mask stage 1, while holding the mask M, is capable of moving in the X axial, Y axial, and θZ directions by a drive system 1D that comprises actuators such as linear motors. A laser interferometer 4A of the interferometer system 4 measures the position of the mask stage 1 (mask M). The laser interferometer 4A uses a measurement mirror 1R, which is provided to the mask stage 1, to measure the position of the mask stage 1 in the X axial, Y axial, and θZ directions. Based on the measurement results of the interferometer system 4, the control apparatus 5 uses the drive system 1D to control the position of the mask M, which is held by the mask stage 1.

The projection optical system PL projects an image of the pattern of the mask M to the substrate P at a prescribed projection magnification. The projection optical system PL comprises the plurality of optical elements, which is held by a lens barrel PK. The projection optical system PL of the present embodiment is a reduction system that has a projection magnification of, for example, ¼, ⅕, or ⅛. Furthermore, the projection optical system PL may also be a unity magnification system or an enlargement system. In the present embodiment, an optical axis AX of the projection optical system PL is parallel to the Z axial directions. In addition, the projection optical system PL may be: a dioptric system that does not include catoptric elements; a catoptric system that does not include dioptric elements; or a catadioptric system that includes both catoptric and dioptric elements. In addition, the projection optical system PL may form either an inverted image or an erect image.

In addition, the exposure apparatus EX comprises an optical adjusting apparatus, which is capable of optically adjusting the projection optical system PL. In the present embodiment, the exposure apparatus EX comprises an image forming characteristic adjusting apparatus 11, which serves as the optical adjusting apparatus and is capable of adjusting image forming characteristics of the projection optical system PL. Examples of the image forming characteristic adjusting apparatus 11 are disclosed in, for example, U.S. Pat. No. 4,666,273, U.S. Pat. No. 6,235,438, and U.S. Patent Application Publication No. 2005/0206850. The image forming characteristic adjusting apparatus 11 of the present embodiment comprises a drive apparatus that is capable of moving some of the optical elements of the plurality of optical elements of the projection optical system PL. The drive apparatus is capable of moving specific optical elements of the plurality of optical elements of the projection optical system PL in the optical axis AX directions (the Z axial directions). In addition, the drive apparatus is capable of inclining the specified optical element with respect to the optical axis AX. The image forming characteristic adjusting apparatus 11 adjusts the image forming characteristics of the projection optical system PL, including various aberrations (projection magnification, distortion, spherical aberration, and the like) and the image plane position (the focal point position), by moving the specific optical elements of the projection optical system PL. Furthermore, the image forming characteristic adjusting apparatus 11 may comprise a pressure adjusting apparatus that adjusts the pressure of gas in spaces between some of the optical elements that are held inside the lens barrel PK. The control apparatus 5 controls the image forming characteristic adjusting apparatus 11.

The substrate stage 2 is capable of holding the substrate P at a position at which it is irradiated by the exposure light EL. The substrate stage 2 comprises the holder part 2H, which detachably holds the substrate P. The holder part 2H has a holding surface capable of opposing the rear surface of the substrate P. The substrate stage 2 is capable of moving—while holding the substrate P with the holder part 2H—in the X and Y axial directions within a prescribed area that includes the position at which it opposes the nozzle member 6 and the lower surface 7 of the last optical element FL (namely, the irradiated position with the exposure light EL).

The substrate stage 2, while holding the substrate P with the holder part 2H, is capable of moving on a base member 13 with six degrees of freedom—i.e., in the X axial, Y axial, Z axial, θX, θY, and θZ directions—using a drive system 2D that comprises actuators such as linear motors. The holder part 2H is disposed in a recessed part 2R of the substrate stage 2. The holder part 2H is capable of holding the substrate P so that its front surface is substantially parallel to the XY plane. In the present embodiment, an upper surface 2F around the recessed part 2R of the substrate stage 2 and the front surface of the substrate P held by the holder part 2H are disposed substantially within the same plane (in other words, they are flush with one another).

A laser interferometer 4B of the interferometer system 4 measures the position of the substrate stage 2 (the substrate P) in the X axial, Y axial, and θZ directions. The laser interferometer 4B uses a measurement mirror 42R of the substrate stage 2 to measure the position of the substrate stage 2 in the X axial, Y axial, and θZ directions. In addition, a focus and level detection system (not shown) detects the position (position in the Z axial, θX, and θY directions) of the front surface of the substrate P, which is held by the holder part 2H of the substrate stage 2. Based on the measurement results of the laser interferometer 4B and the detection results of the focus and level detection system, the control apparatus 5 uses the drive system 2D to control the position of the substrate P, which is held by the substrate stage 2.

A fiducial member (measuring member), whereon a fiducial mark is formed, and measuring instruments (various photoelectric sensors and the like), which perform measurements related to the exposing process, are mounted to the measurement stage 3, which is capable of moving on the base member 13 with six degrees of freedom—i.e., in the X axial, Y axial, Z axial, θX, θY, and θZ directions—using a drive system 3D that includes actuators such as linear motors. A laser interferometer 4C of the interferometer system 4 measures the position of the measurement stage 3. The laser interferometer 4C uses a measurement mirror 43R of the measurement stage 3 to measure the position of the measurement stage 3 in the X axial, Y axial, and θZ directions. The control apparatus 5 controls the position of the measurement stage 3 via the drive system 3D based on the measurement result of the laser interferometer 4C.

The substrate stage 2 and the measurement stage 3 are capable of moving independently of one another within the prescribed area on the base member 13 that includes the position at which they oppose the nozzle member 6 and the lower surface 7 of the last optical element FL (namely, the position at which these stages are irradiated by the exposure light EL). In addition, in the present embodiment, the immersion space LS is capable of moving from the upper surface of the substrate stage 2 to the upper surface of the measurement stage 3 and vice versa, as disclosed in, for example, European Patent Application Publication No. 1,713,113. Namely, in the present embodiment, the control apparatus 5 causes the substrate stage 2 and the measurement stage 3 to move synchronously in the state wherein the substrate stage 2 and the measurement stage 3 are proximate or in contact with one another so that a space capable of holding the liquid LQ continues to be formed between at least one of the substrate stage 2 and the measurement stage 3 on one side and the nozzle member 6 and the last optical element FL on the other side. Thereby, the immersion space LS moves from the upper surface of the substrate stage 2 to the upper surface of the measurement stage 3 and vice versa.

The exposure apparatus EX comprises supply ports 14, which supply the liquid LQ to the optical path space K of the exposure light EL, and a recovery port 15, which recovers the liquid LQ. In the present embodiment, the supply ports 14 and the recovery port 15 are provided to the nozzle member 6. A liquid supply apparatus 17 is connected to the supply ports 14 via supply pipes 16. A liquid recovery apparatus 19 is connected to the recovery port 15 via a recovery pipe 18. In the present embodiment, a porous member (mesh) is disposed in the recovery port 15.

The liquid supply apparatus 17 comprises a liquid temperature adjusting apparatus 20, which adjusts the temperature of the liquid LQ to be supplied. In addition, the liquid supply apparatus 17 comprises a degassing apparatus, which reduces the gas component in the liquid LQ, and a filter unit, which removes foreign matter in the liquid LQ. The liquid supply apparatus 17 is capable of supplying the liquid LQ, which is pure and whose temperature has been adjusted. The liquid recovery apparatus 19 comprises a vacuum system and is capable of recovering the liquid LQ. After the liquid LQ that is fed from the liquid supply apparatus 17 flows through the supply pipes 16 and the supply passageways of the nozzle member 6, it is supplied to the optical path space K of the exposure light EL (on the substrate P) via the supply ports 14. In addition, the liquid LQ that is recovered via the recovery port 15 by driving the liquid recovery apparatus 19 flows through the recovery passageway of the nozzle member 6 and is then recovered by the liquid recovery apparatus 19 via the recovery pipe 18.

The control apparatus 5 forms the immersion space LS so that the liquid LQ fills the optical path space K of the exposure light EL by performing the liquid supply operation using the liquid supply apparatus 17 and the liquid recovery operation using the liquid recovery apparatus 19 in parallel. An immersion region of the liquid LQ, which is larger than the projection area and smaller than the substrate P, is formed on the substrate P so that it covers the projection area of the projection optical system PL.

At least during the projection of the image of the pattern of the mask M onto the substrate P, the exposure apparatus EX uses the nozzle member 6 to form the immersion space LS so that the liquid LQ fills the optical path space K of the exposure light EL. The exposure apparatus EX irradiates the substrate P, which is held by the holder part 2H of the substrate stage 2, with the exposure light EL that passes through the mask M, the projection optical system PL, and the liquid LQ of the immersion space LS. Thereby, the image of the pattern of the mask M is projected onto the substrate P, which is thereby exposed.

The substrate temperature adjusting apparatus 9 is capable of adjusting the temperature of the substrate P, which is held by the holder part 8H. At least part of the substrate temperature adjusting apparatus 9 is provided in the interior of the holding member 8, and the control apparatus 5 is capable of adjusting the temperature of at least the holder part 8H using the substrate temperature adjusting apparatus 9. By adjusting the temperature of the holder part 8H, the substrate temperature adjusting apparatus 9 can adjust the temperature of the substrate P, which is held by the holder part 8H. The temperature of the holder part 8H and the temperature of the substrate P—after it is held by the holder part 8H and its temperature has been adjusted—are substantially equal.

In the present embodiment, the substrate temperature adjusting apparatus 9 comprises a passageway, which is formed in the interior of the holding member 8, and a fluid supply mechanism, that flows a fluid, the temperature of which has been adjusted, to that passageway. The temperature of the holder part 8H (and, by extension, the substrate P) is adjusted by the fluid that flows through the passageway. Furthermore, the substrate temperature adjusting apparatus 9 comprises a Peltier element, a heater, or the like to adjust the temperature of the holder part 8H (and thereby the temperature of the substrate P).

FIG. 2 is a plan view from above of the substrate stage 2 and the measurement stage 3. A fiducial plate 21, wherein first and second fiducial marks FM1, FM2 are formed, that is used in a process (an alignment process) that aligns the image of the pattern and a shot region on the substrate P is provided as a measuring instrument (a measuring member) at a prescribed position on an upper surface 3F of the measurement stage 3.

In addition, an opening 22 is formed at a prescribed position of the upper surface 3F of the measurement stage 3. Furthermore, at least part of an aerial image measuring apparatus 23, which measures an image forming characteristic (optical characteristic) of the projection optical system PL as disclosed in, for example, U.S. Patent Application Publication No. 2002/041377, is disposed below (on the –Z direction side of) the opening 22. The aerial image measuring apparatus 23 is capable of detecting the state of the pattern image that is formed via the projection optical system PL and the liquid LQ. When the aerial image measuring apparatus 23 is used to detect the pattern image state, the mask M wherein the prescribed pattern (for example, a measurement pattern) is formed, is disposed on the mask stage 1. The control apparatus 5 causes the lower surface 7 of the last optical element FL and the opening 22 of the upper surface 3F to oppose one another and forms the immersion space LS so that the liquid LQ fills the optical path space K of the exposure light EL between the lower surface 7 of the last optical element FL and the upper surface 3F, which includes the opening 22. The control apparatus 5 uses the illumination system IL to illuminate the mask M with the exposure light EL. The exposure light EL that is radiated to the mask M travels through the mask M and enters the projection optical system PL. The exposure light EL that enters the projection optical system PL travels through the projection optical system PL and the liquid LQ and is radiated to the opening 22. The image of the pattern of the mask M is projected to the opening 22 via the projection optical system PL and the liquid LQ. Thereby, the aerial image measuring apparatus 23, which is disposed below the opening 22, can detect the state of the pattern image that is formed through the projection optical system PL in the liquid LQ. Furthermore, the pattern used for detecting the state of the image by the aerial image measuring apparatus 23 may be disposed in part of the mask stage 1.

Figure 3:
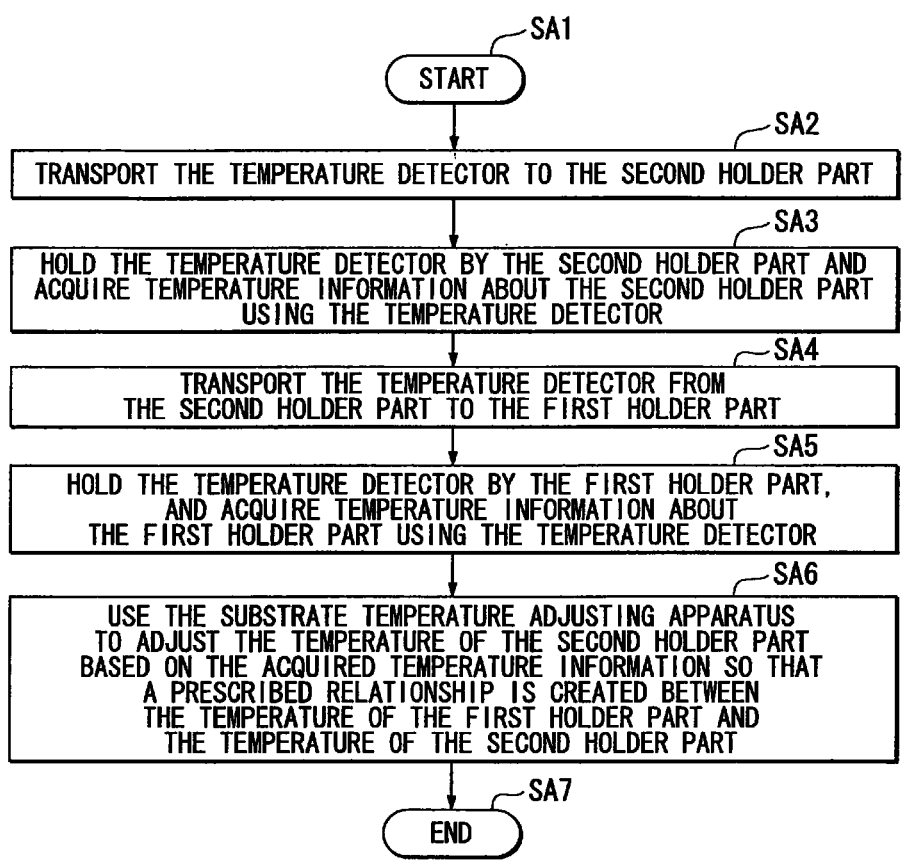
FIG. 3 is a flow chart for explaining the adjusting method according to the first embodiment.

The following explains one example of a method of adjusting the exposure apparatus EX, which has the configuration discussed above, referencing the flow charts in FIG. 3, FIG. 4, and FIG. 5. In the explanation below, the holder part 2H of the substrate stage 2 is discretionarily called the first holder part 2H, and the holder part 8H of the holding member 8 is discretionarily called the second holder part 8H.

The adjusting method of the present embodiment comprises: a first process (steps SA1-SA7), which creates a prescribed relationship between the temperature of the first holder part 2H and the temperature of the second holder part 8H; a second process (steps SB1-SB5), which creates a prescribed relationship between the temperature of the first holder part 2H and the temperature of the liquid LQ; and a third process (steps SC1-SC4), which performs an optical adjustment.

Figure 6:
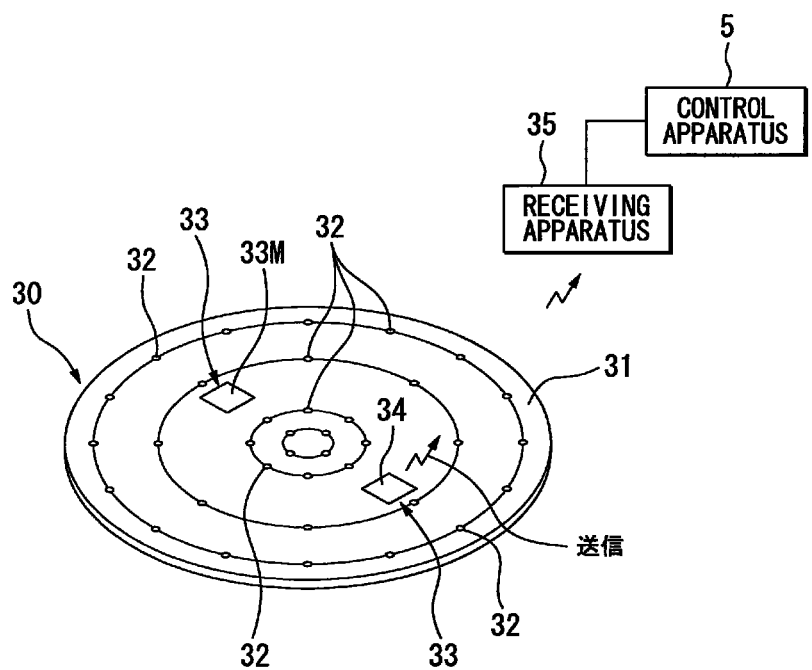
FIG. 6 shows one example of a temperature detector.

In the present embodiment, when at least part of the first process and the second process discussed above is performed, a temperature detector 30 as shown in FIG. 6 is used. The temperature detector 30 comprises: a base material 31; a plurality of temperature detecting parts 32, which is disposed in the base material 31; and processing units 33, which process the detection results of the temperature detecting parts 32. Each of the processing units 33 comprises a storage device 33M, which stores the detection results of the temperature detecting parts 32. In addition, each of the processing units 33 comprises a transmitting apparatus 34, which wirelessly transmits the detection results of the temperature detecting parts 32 to an external receiving apparatus 35. The receiving apparatus 35 is connected to the control apparatus 5, and outputs the detection results of the temperature detecting parts 32 to the control apparatus 5. The control apparatus 5 performs a prescribed process based on the detection results of the temperature detecting parts 32. Furthermore, each of the processing units 33 may not comprise a transmitting apparatus 34 and, instead, the temperature detector 30 may be unloaded from the exposure apparatus EX and the information stored in the storage device 33M (the storage apparatus) may be read out.

The external shape of the temperature detector 30 is substantially the same as that of the substrate P. The first holder part 2H and the second holder part 8H can each detachably hold the temperature detector 30. The temperature detector 30 can acquire temperature information about the first holder part 2H when the temperature detector 30 is held thereby and can acquire temperature information about the second holder part 8H when the temperature detector 30 is held thereby. In the present embodiment, the temperature of the substrate P held by the second holder part 8H is adjusted to a temperature that is substantially the same as the second holder part 8H, and therefore measuring the temperature of the second holder part 8H makes it possible to measure the temperature of the substrate P after it is unloaded from the second holder part 8H and its temperature has been adjusted. In addition, the temperature detector 30 can acquire temperature information of the liquid LQ that is supplied onto the temperature detector 30.

In addition, the transport apparatus 10, which is capable of transporting the substrate P, can transport the temperature detector 30. The transport apparatus 10 can transport the temperature detector 30 between the first holder part 2H and the second holder part 8H.

First, the first process is performed to create the prescribed relationship between the temperature of the first holder part 2H and the temperature of the second holder part 8H. When an instruction to start the first process is issued (step SA1), the temperature detector 30 is loaded to the second holder part 8H (step SA2). In the present embodiment, the transport apparatus 10 loads the temperature detector 30 to the second holder part 8H.

Figure 7A:
FIG. 7A is a schematic view for explaining the adjusting method according to the first embodiment.

As shown in the schematic drawing of FIG. 7A, the second holder part 8H holds the temperature detector 30. The temperature detector 30, which is held by the second holder part 8H, acquires temperature information about the second holder part 8H (step SA3). The temperature information about the second holder part 8H that is acquired by the temperature detector 30 is output to the control apparatus 5 via the transmitting apparatuses 34 of the processing units 33 and via the receiving apparatus 35.

After temperature information about the second holder part 8H is acquired by the temperature detector 30, the temperature detector 30 is transported from the second holder part 8H to the first holder part 2H (step SA4). In the present embodiment, the transport apparatus 10, which transports the substrate P from the second holder part 8H to the first holder part 2H, also transports the temperature detector 30 from the second holder part 8H to the first holder part 2H.

Figure 7B:
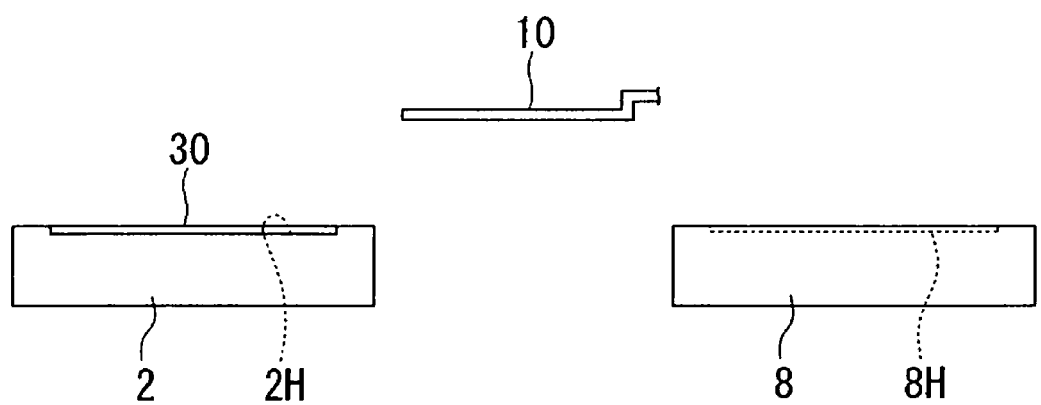
FIG. 7B is a schematic view for explaining the adjusting method according to the first embodiment.

In the schematic drawing of FIG. 7B, the first holder part 2H holds the temperature detector 30. The temperature detector 30, which is held by the first holder part 2H, acquires temperature information about the first holder part 2H (step SA5). The temperature information about the first holder part 2H that is acquired by the temperature detector 30 is output to the control apparatus 5 via the transmitting apparatuses 34 of the processing units 33 and via the receiving apparatus 35.

Based on temperature information about the first holder part 2H acquired by the temperature detector 30 and temperature information about the second holder part 8H acquired by the temperature detector 30, the control apparatus 5 adjusts the temperature of the second holder part 8H using the substrate temperature adjusting apparatus 9 so that a prescribed relationship is created between the temperature of the first holder part 2H and the temperature of the second holder part 8H (step SA6).

In the present embodiment, the control apparatus 5 uses the substrate temperature adjusting apparatus 9 to adjust the temperature of the second holder part 8H so that the temperature differential between the first holder part 2H and the second holder part 8H becomes small. Namely, the temperature of the second holder part 8H is adjusted so that the temperature differential between the temperature of the substrate P, which was transported from the second holder part 8H to the first holder part 2H, and the temperature of the first holder part 2H becomes small. In the present embodiment, the control apparatus 5 uses the substrate temperature adjusting apparatus 9 to adjust the temperature of the second holder part 8H so that the temperature of the second holder part 8H and the temperature of the first holder part 2H substantially coincide.

In the present embodiment, the operation of using the temperature detector 30 to acquire temperature information about the first holder part 2H, the operation of using the temperature detector 30 to acquire temperature information about the second holder part 8H, and the operation of using the substrate temperature adjusting apparatus 9 to adjust the temperature of the second holder part 8H are performed repetitively until the detection result of the temperature detector 30 when held by the first holder part 2H and the detection result of the temperature detector 30 when held by the second holder part 8H substantially coincide. When the operation of using the temperature detector 30 to acquire temperature information about the first holder part 2H and the operation of using the temperature detector 30 to acquire temperature information about the second holder part 8H are performed repetitively, the transport apparatus 10 transports the temperature detector 30 between the first holder part 2H and the second holder part 8H.

Furthermore, when it is determined that the temperature of the first holder part 2H and the temperature of the second holder part 8H have reached the prescribed relationship, namely when it is determined that the temperature of the first holder part 2H and the temperature of the second holder part 8H substantially coincide, the first process ends (step SA7). Namely, the first process ends when the temperature of the first holder part 2H that is detected using the temperature detector 30 immediately after it is held by the first holder part 2H, and the temperature of the first holder part 2H that is detected using the temperature detector 30 after a prescribed time has elapsed since it was held by the first holder part 2H, substantially coincide. The control apparatus 5 stores the control information (for example, the temperature of the fluid that flows inside the second holder part 8H) of the substrate temperature adjusting apparatus 9 when it is determined that the temperature of the first holder part 2H and the temperature of the second holder part 8H substantially coincide.

After the first process ends, in other words, after the process that causes the temperature of the first holder part 2H and the temperature of the second holder part 8H to substantially coincide has ended, the second process is performed in order to create a prescribed relationship between the temperature of the first holder part 2H and the temperature of the liquid LQ. When an instruction to start the second process is issued (step SB1), the temperature detector 30 is held by the first holder part 2H.

Figure 8A:
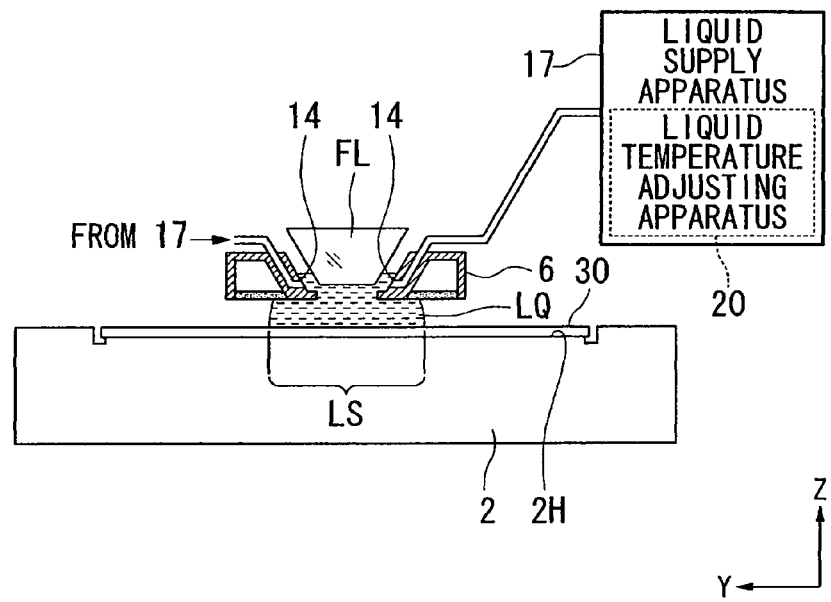
FIG. 8A is a schematic view for explaining the adjusting method according to the first embodiment.

The control apparatus 5 causes the nozzle member 6 and the lower surface 7 of the last optical element FL on one side and the temperature detector 30 held by the first holder part 2H on the other side to oppose one another, and feeds the liquid LQ using the liquid supply apparatus 17. The liquid LQ that is fed by the liquid supply apparatus 17 is supplied via the supply ports 14 onto the temperature detector 30, which is held by the first holder part 2H. Thereby, as shown in the schematic drawing of FIG. 8A, the immersion space LS of the liquid LQ is formed between the nozzle member 6 and the lower surface 7 of the last optical element FL on one side and the temperature detector 30, which is held by the first holder part 2H, on the other side, and the immersion region of the liquid LQ is locally formed on part of the front surface of the temperature detector 30 (step SB2). The temperature detector 30 acquires temperature information about the first holder part 2H. The temperature information about the first holder part 2H acquired by the temperature detector 30 is output to the control apparatus 5 via the transmitting apparatuses 34 of the processing units 33 and via the receiving apparatus 35. Furthermore, the temperature detector 30 acquires temperature information about the liquid LQ of the immersion space LS (immersion region). The temperature information about the liquid LQ acquired by the temperature detector 30 is output to the control apparatus 5 via the transmitting apparatuses 34 of the processing units 33 and via the receiving apparatus 35 (step SB3).

Based on temperature information about the first holder part 2H acquired by the temperature detector 30 and temperature information about the liquid LQ acquired by the temperature detector 30, the control apparatus 5 uses the liquid temperature adjusting apparatus 20 to adjust the temperature of the liquid LQ supplied via the supply ports 14 so that the temperature of the first holder part 2H and the temperature of the liquid LQ reach the prescribed relationship (step SB4).

In the present embodiment, the control apparatus 5 uses the liquid temperature adjusting apparatus 20 to adjust the temperature of the liquid LQ so that the temperature differential between the first holder part 2H and the liquid LQ becomes small. In other words, the control apparatus 5 uses the liquid temperature adjusting apparatus 20 to adjust the temperature of the liquid LQ so that the temperature of the liquid LQ and the temperature of the first holder part 2H substantially coincide.

Figure 8B:
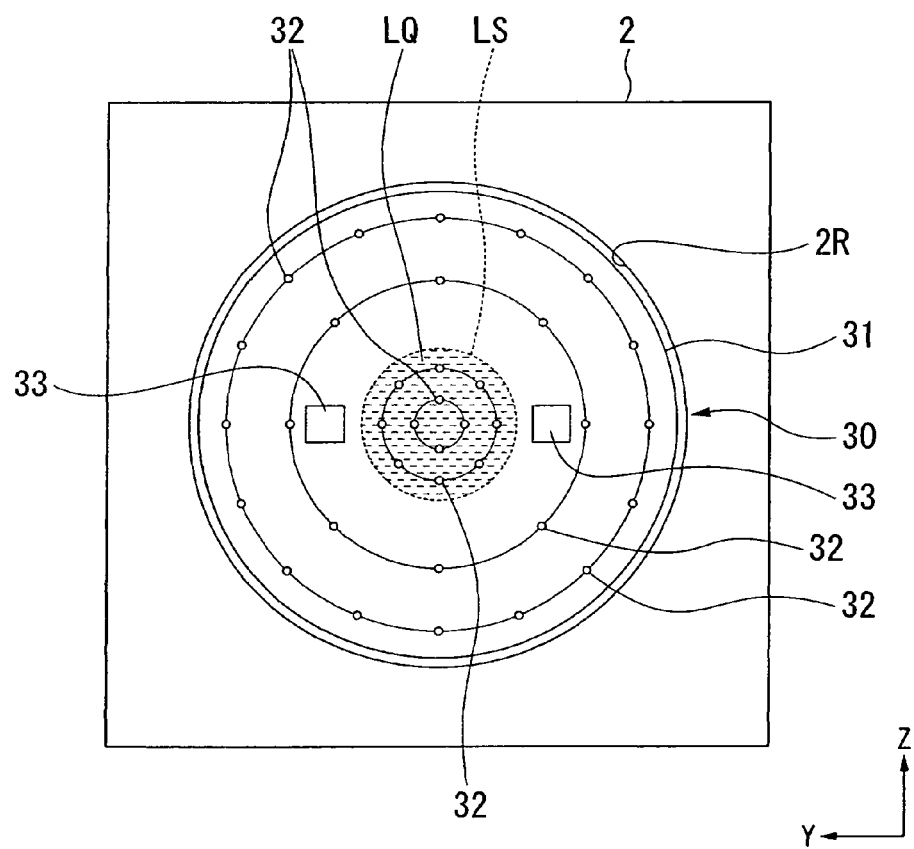
FIG. 8B is a schematic view for explaining the adjusting method according to the first embodiment.

In the present embodiment, as shown in FIG. 8B, the immersion region of the liquid LQ is formed locally on part of the front surface of the temperature detector 30. In other words, the front surface of the temperature detector 30 has a portion that the liquid LQ of the immersion region (immersion space) contacts and a portion that the liquid LQ of the immersion region (immersion space) does not contact. Accordingly, the temperature detector 30 can acquire temperature information about the liquid LQ at the portion that the liquid LQ of the immersion region contacts and can acquire temperature information about the first holder part 2H at the portion that the liquid LQ of the immersion region does not contact. Thus, in the present embodiment, the temperature detector 30 can simultaneously acquire temperature information about the first holder part 2H and temperature information about the liquid LQ. Furthermore, the acquisition of temperature information about the first holder part 2H and temperature information about the liquid LQ does not have to be simultaneous. For example, temperature information about the first holder 2H may be acquired based on the detection result of the temperature detector 30 held by the first holder part 2H when the immersion region of the liquid LQ is not formed on the front surface of the temperature detector 30, and temperature information about the liquid LQ may be acquired based on the detection result of the temperature detector 30 (the portion that the liquid LQ contacts) held by the first holder part 2H when the immersion region of the liquid LQ is formed in part of the front surface of the temperature detector 30.

While monitoring temperature information about the first holder part 2H and temperature information about the liquid LQ output from the temperature detector 30, the control apparatus 5 uses the liquid temperature adjusting apparatus 20 to adjust the temperature of the liquid LQ so that the temperature of the liquid LQ and the temperature of the first holder part 2H substantially coincide. Furthermore, the operation of acquiring the temperature information of the first holder part 2H using the temperature detector 30, the operation of acquiring the temperature information of the liquid LQ using the temperature detector 30, and the operation of adjusting the temperature of the liquid LQ using the liquid temperature adjusting apparatus 20 based on that acquired temperature information continue until the detection results detected by the temperature detecting parts 32 at the portion that the liquid LQ does not contact and the detection results detected by the temperature detecting parts 32 at the portion that the liquid LQ does contact substantially coincide.

In addition, in the present embodiment, the control apparatus 5 performs the operation of acquiring temperature information about the liquid LQ using the temperature detector 30 and the operation of acquiring temperature information about the first holder part 2H using the temperature detector 30 while the substrate stage 2, which holds the temperature detector 30, is moved in the X and Y directions with respect to the nozzle member 6 and the last optical element FL. In other words, in the present embodiment, the immersion region of the liquid LQ is formed sequentially at multiple positions on the front surface of the temperature detector 30, and temperature information about the liquid LQ and temperature information about the first holder part 2H is acquired sequentially. The control apparatus 5 processes the multiple pieces of temperature information sequentially acquired and adjusts the temperature of the liquid LQ based on the processing result. For example, the control apparatus 5 adjusts the temperature of the liquid LQ so that the average value of the multiple temperatures and the temperature of the first holder part 2H coincide.

Furthermore, when it is determined that the temperature of the first holder part 2H and the temperature of the liquid LQ that is supplied via the supply ports 14 substantially coincide, the second process ends (step SB5). The control information of the liquid temperature adjusting apparatus 20 (for example, the temperature of the fluid whose heat is exchanged with the liquid LQ) when it is determined that the temperature of the first holder part 2H and the temperature of the liquid LQ substantially coincide is stored in the control apparatus 5.

After the first process and the second process end—namely after the processes that make the temperature of the first holder part 2H, the temperature of the second holder part 8H, and the temperature of the liquid LQ substantially coincide end—the third process is executed, which performs an optical adjustment. The optical adjustment includes the adjustment of the projection optical system PL. When an instruction to start the third process is issued (step SC1), an operation is performed that detects the state of the image formed through the liquid LQ (step SC2). In the present embodiment, the operation that detects the state of the pattern image formed through the projection optical system PL and the liquid LQ is performed using the aerial image measuring apparatus 23.

As shown in the schematic drawing of FIG. 9, the mask M, wherein a prescribed measurement pattern is formed, is disposed on the mask stage 1 in order to detect the state of the pattern image. The control apparatus 5 causes the lower surface 7 of the last optical element FL and the opening 22 of the upper surface 3F to oppose one another, and forms the immersion space LS so that the liquid LQ fills the optical path space K of the exposure light EL between the lower surface 7 of the last optical element FL and the upper surface 3F, which includes the opening 22. The control apparatus 5 controls the liquid temperature adjusting apparatus 20 based on the stored control quantity (adjustment quantity) derived by the second process discussed above. Thereby, the liquid LQ whose temperature was adjusted to a desired temperature by the second process discussed above is supplied onto the measurement stage 3. Furthermore, it is preferable to perform such an adjustment so that the temperature of the upper surface 3F of the measurement stage 3 and the temperature of the first holder part 2H substantially coincide. In other words, it is preferable to adjust the temperature of the measurement stage 3 (the upper surface 3F) in advance so that the temperature of the upper surface 3F of the measurement stage 3 and the temperature of the liquid LQ supplied to the upper surface 3F coincide.

The control apparatus 5 uses the illumination system IL to illuminate the mask M with the exposure light EL. By illuminating the mask M with the exposure light EL, an image of the pattern of the mask M is projected through the projection optical system PL and the liquid LQ to the opening 22. The aerial image measuring apparatus 23, which is disposed below the opening 22, detects the state of the pattern image that is formed through the projection optical system PL and the liquid LQ.

The measurement result of the aerial image measuring apparatus 23 is output to the control apparatus 5. The control apparatus 5 uses the image forming characteristic adjusting apparatus 11 to optically adjust the projection optical system PL based on the state of the pattern image detected by the aerial image measuring apparatus 23 (step SC3). Thereby, the image forming characteristic of the projection optical system PL is optimized. In so doing, the third process ends (step SC4). Furthermore, instead of using the mask M, a measurement mark may be provided to the mask stage 1.

As discussed above, before the exposure of the substrate P, it is held by the first holder part 2H of the substrate stage 2 and before that it is held by the second holder part 8H of the holding member 8. The holding member 8 adjusts the temperature of the substrate P, which is held by the second holder part 8H. The substrate temperature adjusting apparatus 9 adjusts the temperature of the substrate P, which is held by the second holder part 8H, by adjusting the temperature of the second holder part 8H. The temperature of the second holder part 8H and the temperature of the substrate P—after it has been held by the second holder part 8H and its temperature has been adjusted—are substantially equal. Accordingly, in the first process, it is possible to make the temperature of the first holder part 2H and the temperature of the substrate P after its temperature has been adjusted by the second holder part 8H substantially coincide by making the temperature of the first holder part 2H and the temperature of the second holder part 8H substantially coincide. Namely, the first process can make the temperature of the substrate P—after it has been held by the second holder part 8H of the holding member 8 and its temperature has been adjusted—and the temperature of the first holder part 2H of the substrate stage 2 substantially coincide. In other words, the first process discussed above is used to make the temperature of the first holder part 2H, the temperature of the second holder part 8H, and the temperature of the substrate P—after it has been held by the second holder part 8H and its temperature has been adjusted—substantially coincide. Consequently, if the substrate P—after it has been held by the second holder part 8H and its temperature has been adjusted—is held by the first holder part 2H, then there is substantially no temperature differential between the substrate P and the first holder part 2H, which makes it possible to prevent, for example, thermal deformation of the substrate P due to a temperature differential between the substrate P and the first holder part 2H.

In addition, in the second process, making the temperature of the first holder part 2H and the temperature of the liquid LQ substantially coincide makes it possible to make the temperature of the liquid LQ that is supplied via the supply ports 14 and the temperature of the substrate P, which is held by the first holder part 2H, substantially coincide. Consequently, when the liquid LQ is supplied to the substrate P, which is held by the first holder part 2H, there is no substantial temperature differential between the substrate P and the liquid LQ, which makes it possible to prevent, for example, thermal deformation of the substrate P and changes in the optical characteristics (e.g., the refractive index with respect to the exposure light EL) of the liquid LQ due to a temperature differential between the substrate P and the supplied liquid LQ.

In addition, in the present embodiment, after the first process and the second process are complete, the third process is performed, which makes it possible to prevent, for example, image forming errors due to a temperature differential between the lower surface 7 of the last optical element FL and the liquid LQ and thereby to project a desired pattern image onto the substrate P when the substrate P is exposed.

According to the present embodiment as explained above, it is possible to use the temperature detector 30 to create a desired relationship between the temperature of the second holder part 8H of the holding member 8 and the temperature of the first holder part 2H of the substrate stage 2. Accordingly, it is possible to prevent exposure failures from occurring due to a temperature differential between the substrate P and the first holder part 2H.

In addition, according to the present embodiment, it is possible to use the temperature detector 30 to create a desired relationship between the temperature of the first holder part 2H and the temperature of the liquid LQ that is supplied to the substrate P, which is held by the first holder part 2H. Accordingly, it is possible to prevent exposure failures from occurring due to a temperature differential between the substrate P and the liquid LQ.

Furthermore, in the present embodiment, an aerial image of the pattern is detected using the aerial image measuring apparatus 23 in order to detect the state of the pattern image in the third process, but it is also possible to detect the state of the pattern image without using the aerial image measuring apparatus 23. For example, after the second process is complete, the state of the pattern image can be detected by exposing a test substrate through the liquid LQ (a test exposure), developing the exposed test substrate, and detecting the state of the pattern formed in the test substrate using a pattern shape detection apparatus, such as an SEM. In addition, the third process may be performed without using the mask M by using a measurement mark that is provided to the mask stage 1.

Second Embodiment

The following explains a second embodiment of the present invention. In the explanation below, constituent parts that are identical or equivalent to those in the embodiment discussed above are assigned identical symbols, and the explanations thereof are therefore abbreviated or omitted.

As discussed above, the temperature detector 30 comprises a plurality of temperature detecting parts 32, which makes it possible to detect the temperature distribution of the first holder part 2H, the temperature distribution of the second holder part 8H, and the temperature distribution of the liquid LQ in the immersion region (immersion space).

In the present embodiment, the control apparatus 5 uses the temperature detector 30 to acquire temperature distribution information about the holding surface of the first holder part 2H and temperature distribution information about the holding surface of the second holder part 8H in the first process, which is for creating a prescribed relationship between the temperature of the first holder part 2H and the temperature of the second holder part 8H. Furthermore, the control apparatus 5 controls a substrate temperature adjusting apparatus 9B based on the temperature distribution information about the first holder part 2H acquired by the temperature detector 30 and the temperature distribution information about the second holder part 8H acquired by the temperature detector 30.

Figure 10:
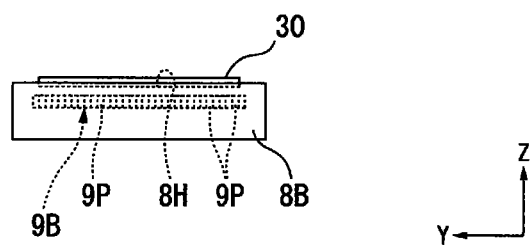
FIG. 10 is a schematic view for explaining the holding member according to the second embodiment.

FIG. 10 is a schematic drawing that shows a holding member 8B according to the present embodiment. In the present embodiment, the substrate temperature adjusting apparatus 9B is capable of adjusting the temperature distribution of the holding surface of the second holder part 8H. In the present embodiment, the substrate temperature adjusting apparatus 9B comprises multiple Peltier elements 9P, which are disposed within a plane parallel to the holding surface of the second holder part 8H. The temperature of each of the Peltier elements 9P varies with the electric power (including the polarity and the amount of current) that is supplied thereto. The control apparatus 5 can adjust the temperature distribution of the holding surface of the second holder part 8H by adjusting the electric power supplied to each of the Peltier elements 9P.

Figure 11A:
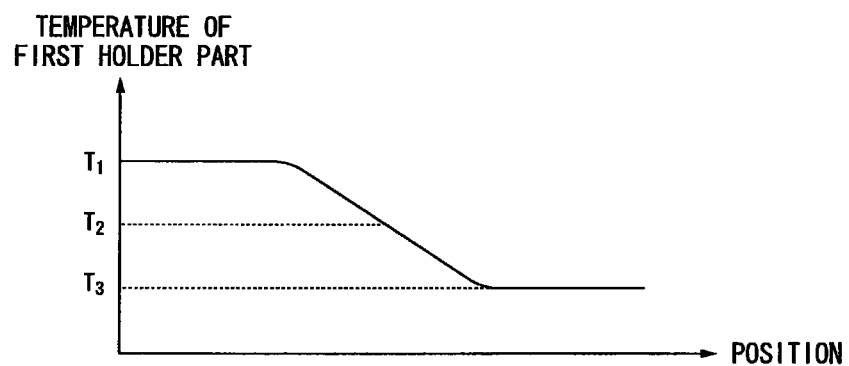
FIG. 11A is a schematic view for explaining the adjusting method according to the second embodiment.

For example, consider a case wherein the holding surface of the first holder part 2H has the temperature distribution shown in the schematic drawing of FIG. 11A. The abscissa in FIG. 11A is the position of the holding surface of the first holder part 2H in prescribed directions (e.g., the Y axial directions), and the ordinate is the temperature of the holding surface of the first holder part 2H. If the first holder part 2H has the temperature distribution shown in FIG. 11A due to the impact of, for example, the drive system 2D, then it is possible to detect the temperature distribution of the first holder part 2H with the temperature detector 30.

Figure 11B:
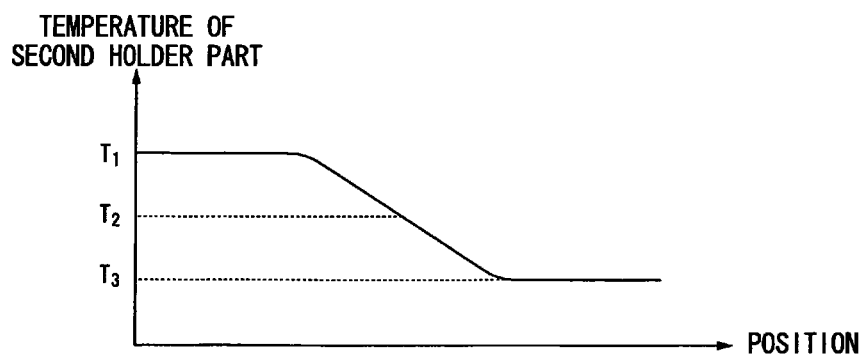
FIG. 11B is a schematic view for explaining the adjusting method according to the second embodiment.

In accordance with the temperature distribution of the holding surface of the first holder part 2H, the control apparatus 5 uses the substrate temperature adjusting apparatus 9B to adjust the temperature distribution of the holding surface of the second holder part 8H. When the temperature distribution of the second holder part 8H is adjusted, the temperature detector 30 is held thereby. The control apparatus 5 controls each of the Peltier elements 9P of the substrate temperature adjusting apparatus 9B while monitoring the temperature distribution information of the second holder part 8H output from the temperature detector 30. In the present embodiment, the control apparatus 5 controls the substrate temperature adjusting apparatus 9B so that the temperature distribution of the holding surface of the first holder part 2H and the temperature distribution of the holding surface of the second holder part 8H coincide. FIG. 11B is a schematic drawing that shows the temperature distribution of the holding surface of the second holder part 8H after it has been adjusted, wherein the abscissa is the position of the holding surface of the second holder part 8H in prescribed directions (for example, the Y axial directions), and the ordinate is the temperature of the holding surface of the second holder part 8H. Thus, in the present embodiment, the control apparatus 5 makes the temperature distribution of the holding surface of the first holder part 2H and the temperature distribution of the holding surface of the second holder part 8H substantially coincide. In other words, in the present embodiment, the temperature distribution of the holding surface of the first holder part 2H and the temperature distribution of the substrate P immediately before it is held by the first holder part 2H are made to coincide substantially. Thereby, it is possible to prevent, for example, thermal deformation of the substrate P from occurring due to a difference in the temperature distribution of the substrate P and the temperature distribution of the holding surface of the first holder part 2H.

Figure 12:
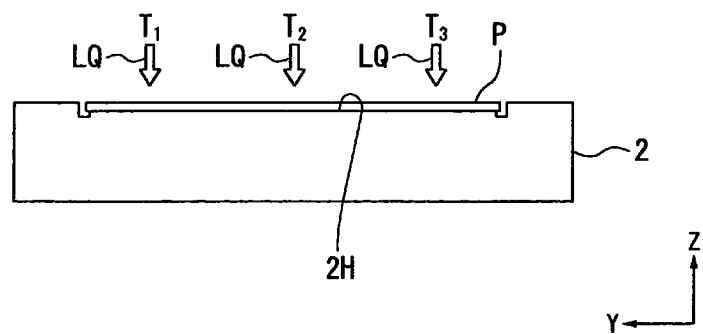
FIG. 12 is a schematic view for explaining the adjusting method according to the second embodiment.

In addition, in accordance with the temperature distribution of the holding surface of the first holder part 2H, the control apparatus 5 uses the liquid temperature adjusting apparatus 20 to adjust the temperature of the liquid LQ on the substrate P, which is held by the first holder part 2H. In other words, if the holding surface of the first holder part 2H has a temperature distribution like that shown in FIG. 11A, then the control apparatus 5 adjusts the liquid temperature adjusting apparatus 20 so that the temperature of the liquid LQ supplied onto the substrate P changes at each position of a plurality of positions of the front surface of the substrate P when the substrate P is exposed. In the present embodiment, as shown in the schematic drawing of FIG. 12, the control apparatus 5 controls the liquid temperature adjusting apparatus 20 so that the temperature distribution of the holding surface of the first holder part 2H and the temperature of the liquid LQ that is supplied to each position of the plurality of positions of the front surface of the substrate P, which is held by the first holder part 2H, substantially coincide.

In the second embodiment as described above, even if the first holder part 2H has a temperature distribution, it is possible to prevent exposure failures from occurring due to a temperature differential between, for example, the substrate P and the first holder part 2H as well as between the substrate P and the liquid LQ.

Furthermore, in the present embodiment, the Peltier elements 9P are used to adjust the temperature of the second holder part 8H; however, similar to the case of the first embodiment, the temperature of the second holder part 8H may be adjusted by flowing a fluid, whose temperature has been adjusted, through a passageway inside the second holder part 8H.

In addition, similar to the case in the first embodiment, when the substrate P is exposed, the temperature of the liquid LQ supplied via the supply ports 14 does not have to be changed.

Third Embodiment

The following explains a third embodiment of the present invention. In the explanation below, constituent parts that are identical or equivalent to those in the embodiment discussed above are assigned identical symbols, and the explanations thereof are therefore abbreviated or omitted.

Figure 13:
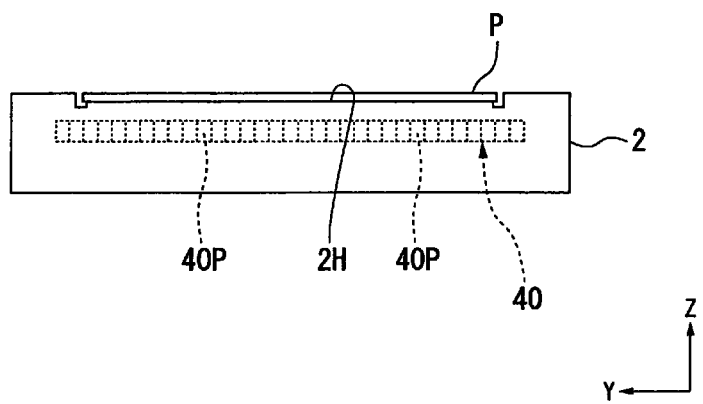
FIG. 13 is a schematic view for explaining a substrate stage according to a third embodiment.

FIG. 13 shows one example of a substrate stage 2 according to the third embodiment. In FIG. 13, the exposure apparatus EX comprises a temperature adjusting apparatus 40, which adjusts the temperature of the first holder part 2H. The temperature adjusting apparatus 40 comprises a plurality of Peltier elements 40P and can adjust the temperature distribution of the holding surface of the first holder part 2H.

In the present embodiment, the control apparatus 5 can adjust the temperature of the first holder part 2H using the temperature adjusting apparatus 40 so that a prescribed relationship is created between the temperature of the first holder part 2H and the temperature of the second holder part 8H. For example, the control apparatus 5 can control the temperature adjusting apparatus 40 so that the temperature of the first holder part 2H and the temperature of the second holder part 8H substantially coincide. Furthermore, in order to create the prescribed relationship between the temperature of the first holder part 2H and the temperature of the second holder part 8H, the operation of using the temperature adjusting apparatus 40 to adjust the temperature of the first holder part 2H may be performed alone or together with the operation of using the substrate temperature adjusting apparatus 9 to adjust the temperature of the second holder part 8H.

Furthermore, if the operation of using the temperature adjusting apparatus 40 to adjust the temperature of the first holder part 2H is performed alone, then the substrate temperature adjusting apparatus 9 does not have to be provided.

In addition, in the present embodiment, the control apparatus 5 can adjust the temperature of the first holder part 2H using the temperature adjusting apparatus 40 so that a prescribed relationship is created between the temperature of the first holder part 2H and the temperature of the liquid LQ. For example, the control apparatus 5 can control the temperature adjusting apparatus 40 so that the temperature of the first holder part 2H and the temperature of the liquid LQ substantially coincide. Furthermore, in order to create the prescribed relationship between the temperature of the first holder part 2H and the temperature of the liquid LQ, the operation of using the temperature adjusting apparatus 40 to adjust the temperature of the first holder part 2H may be performed alone or together with the operation of using the liquid temperature adjusting apparatus 20 to adjust the temperature of the liquid LQ. Furthermore, if the operation of using the temperature adjusting apparatus 40 to adjust the temperature of the first holder part 2H is performed alone, then the liquid temperature adjusting apparatus 20 does not have to be provided. In addition, in the present embodiment, the temperature of the first holder part 2H is adjusted using the Peltier elements 40P, but the temperature of the first holder part 2H may also be adjusted by providing a passageway inside the first holder part 2H and flowing a fluid whose temperature has been adjusted through that passageway.

Furthermore, if the exposure apparatus EX comprises the temperature adjusting apparatus 40, then the first process may be performed after the second process is performed. In particular, if the temperature of the first holder part 2H is adjusted in the second process, then it is preferable to perform the first process, which creates the prescribed relationship between the temperature of the first holder part 2H and the temperature of the second holder part 8H, after the second process.

In the first through third embodiments discussed above, the adjustment is performed based on temperature information acquired by the temperature detector 30 so that the temperature of the first holder part 2H and the temperature of the second holder part 8H substantially coincide, but they do not necessarily have to be made to coincide. For example, there is a possibility that the temperature of the substrate P will change during transport from the holding member 8 to the substrate stage 2. In such a case, the amount of change in temperature of the substrate P during such transport can be derived in advance (estimated in advance), and the temperature of the substrate P can be adjusted by the holding member 8 based on that derived amount of change in temperature. Furthermore, the amount of change in temperature of the substrate P during the transport can be derived in advance, for example, by simulation or empirically.

In other words, the substrate temperature adjusting apparatus 9 of the holding member 8 adjusts the temperature of the substrate P—taking into consideration the amount of change in temperature of the substrate P during transport from the holding member 8 to the substrate stage 2—so that the temperature differential between the first holder part 2H and the substrate P immediately before it is held by the first holder part 2H of the substrate stage 2 becomes small, that is, so the temperature of the first holder part 2H and the temperature of the substrate P immediately before it is held by the first holder part 2H substantially coincide. Thereby, it is possible to prevent, for example, thermal deformation of the substrate P from occurring due to a temperature differential between the substrate P and the first holder part 2H.

In the first through third embodiments discussed above, the substrate temperature adjusting apparatus 9 adjusts the temperature of the substrate P, which is held by the holding member 8 (8H), by adjusting the temperature of the holding member 8 (8H); however, the temperature of the substrate P held by the holding member 8 (8H) may be adjusted without adjusting the temperature of the holding member 8 (8H). For example, the temperature of the substrate P may be adjusted by radiating infrared rays to the substrate P, which is held by the holding member 8 (8H). In this case, in the first process, the temperature adjusting operation may be performed by the temperature detector 30, which is held by the holding member 8 (8H), and, based on the detection result of the temperature detector 30 at that time, the temperature of either the first holder part 2H or the substrate P held by the holding member 8 (8H), or both, should be adjusted so that the temperature of the first holder part 2H and the temperature of the substrate P immediately before it is held by the first holder part 2H substantially coincide.

In addition, in the first through third embodiments discussed above, after either the first process or the second process, other process is performed, however either one alone may be performed.

In addition, in the first through third embodiments discussed above, the third process is performed after the first process and the second process are performed, but the third process may be omitted. For example, the third process can be omitted if image forming errors due to a temperature differential between the liquid LQ and the lower surface 7 of the last optical element FL are within a permissible range. The temperature of the last optical element FL may be adjusted—in parallel with or instead of the third process—so that the temperature differential between the liquid LQ and the last optical element FL becomes small.

In addition, in the first through third embodiments discussed above, the temperature of the liquid LQ and the temperature of either the first holder 2H or the holding member 8 (8H), or both, may be adjusted so that the temperature of the substrate P, which is held by the first holder 2H, and the temperature of the liquid LQ that is supplied onto the substrate P coincide with a prescribed reference temperature (for example, the temperature of the space wherein the substrate P is exposed). In this case as well, the temperature detector 30 should be held by the holding member 8 and the first holder 2H, at least temperature information about the holding member 8 and temperature information about the liquid LQ should be acquired, and, based on those results, the temperature of the liquid LQ and the temperature of either the first holder 2H or the holding member 8 (8H), or both, should be adjusted.

Furthermore, although the liquid LQ in each of the embodiments discussed above is water, it may be a liquid other than water. For example, it is also possible to use hydro-fluoro-ether (HFE), perfluorinated polyether (PFPE), Fomblin oil, cedar oil, or the like as the liquid LQ. In addition, a liquid that has a refractive index of approximately 1.6 to 1.8 may be used as the liquid LQ.

Furthermore, in each of the embodiments discussed above, the optical path space K on the image plane (the emergent surface) side of the last optical element FL of the projection optical system PL is filled with the liquid LQ, but it is also possible to fill the optical path space K on the object plane (the incident surface) side of the last optical element FL with the liquid LQ, as disclosed in PCT International Publication WO2004/019128.

Furthermore, the embodiments discussed above employ an exposure apparatus that locally fills the liquid between the projection optical system PL and the substrate P, but can also employ a liquid immersion exposure apparatus that exposes the entire front surface of a substrate to be exposed in a state wherein the substrate is immersed in liquid, as disclosed in, for example, U.S. Pat. No. 5,825,043.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (synthetic quartz or a silicon wafer) that is used by an exposure apparatus.

A step-and-scan type scanning exposure apparatus (a scanning stepper) that scans and exposes the pattern of the mask M by synchronously moving the mask M and the substrate P or a step-and-repeat type projection exposure apparatus (a stepper) that performs full field exposure of the pattern of the mask M—with the mask M and the substrate P in a stationary state—and then sequentially steps the substrate P can be used as the exposure apparatus EX.

Furthermore, a stitching type full-field exposure apparatus, which performs a full-field exposure of the substrate P, may be used as the exposure apparatus EX; in this case, a step-and-repeat type exposure is performed using a projection optical system to transfer a reduced image of a first pattern onto the substrate P in a state wherein the first pattern and the substrate P are substantially stationary, after which the projection optical system is used to partially superimpose a reduced image of a second pattern onto the transferred first pattern in the state wherein the second pattern and the substrate P are substantially stationary. In addition, a step-and-stitch type exposure apparatus can be used as the stitching type exposure apparatus; in this case, at least two patterns are transferred onto the substrate P so that they partially overlap, after which the substrate P is sequentially stepped.

In addition, as disclosed in, for example, U.S. Pat. No. 6,611,316, the exposure apparatus EX can also be adapted to, for example, an exposure apparatus that combines the patterns of two masks on a substrate through a projection optical system and double exposes, substantially simultaneously, a single shot region on the substrate using a single scanning exposure. In addition, for example, a proximity type exposure apparatus or a mirror projection aligner can be used as the exposure apparatus EX.

In addition, the exposure apparatus EX can also be adapted to a twin stage type exposure apparatus that is provided with a plurality of substrate stages, as disclosed in, for example, U.S. Pat. Nos. 6,341,007, 6,400,441, 6,549,269, 6,590,634, 6,208,407, and 6,262,796. In addition, it can be adapted to an exposure apparatus that comprises a plurality of substrate stages and measurement stages.

The type of exposure apparatus EX is also not limited to a semiconductor device fabrication exposure apparatus that exposes the pattern of a semiconductor device on the substrate P, but can be widely adapted to exposure apparatuses that are used for fabricating, for example, liquid crystal devices or displays, and exposure apparatuses that are used for fabricating thin film magnetic heads, image capturing devices (CCDs), micromachines (MEMS), DNA chips, or reticles and masks.

Furthermore, in each of the embodiments discussed above, the positions of the mask stage 1, the substrate stage 2, and the measurement stage 3 are measured using an interferometer system 4 that comprises the laser interferometers 4A, 4B, 4C, but the present invention is not limited thereto; for example, an encoder system that detects a scale (diffraction grating) provided to each of the stages may be used. In this case, the system is preferably configured as a hybrid system that is provided with both an interferometer system and an encoder system, and it is preferable to use the measurement results of the interferometer system to calibrate the measurement results of the encoder system. In addition, the position of the stages may be controlled by switching between the interferometer system and the encoder system, or by using both.

In addition, in each of the embodiments discussed above, an ArF excimer laser may be used as a light source apparatus that generates ArF excimer laser light that serves as the exposure light EL; however, as disclosed in, for example, U.S. Pat. No. 7,023,610, a harmonic generation apparatus may be used that outputs pulsed light with a wavelength of 193 nm and that comprises: a solid state laser light source, such as a DFB semiconductor laser or a fiber laser; an optical amplifier part, which comprises a fiber amplifier and the like; and a wavelength converting part. Moreover, in the abovementioned embodiments, both the illumination area and the projection area are rectangular, but they may be some other shape, for example, arcuate.

Furthermore, in the embodiments discussed above, a light transmitting type mask is used wherein a prescribed shielding pattern (or a phase pattern or a dimming pattern) is formed on a light transmitting substrate; however, instead of such a mask, a variable forming mask (also called an electronic mask, an active mask, or an image generator), wherein a transmittance pattern, a reflected pattern, or a light emitting pattern is formed based on electronic data of the pattern to be exposed, may be used as disclosed in, for example, U.S. Pat. No. 6,778,257. The variable forming mask comprises a digital micromirror device (DMD), which is one kind of non-emissive type image display device (spatial light modulator). In addition, the variable forming mask is not limited to a DMD, and a non-emissive type image display device, which is explained below, may be used instead. Here, the non-emissive type image display device is a device that spatially modulates the amplitude (the intensity), the phase, or the polarization state of the light that travels in a prescribed direction; furthermore, examples of a transmissive type spatial light modulator include a transmissive type liquid crystal display (LCD) as well as an electrochromic display (ECD). In addition, examples of a reflecting type spatial light modulator include a DMD, which was discussed above, as well as a reflecting mirror array, a reflecting type LCD, an electrophoretic display (EPD), electronic paper (or electronic ink), and a grating light valve.

In addition, instead of a variable forming mask that is provided with a non-emissive type image display device, a pattern forming apparatus that comprises a self luminous type image display device may be provided. In this case, an illumination system is not necessary. Here, examples of a self luminous type image display device include a cathode ray tube (CRT), an inorganic electroluminescence display, an organic electroluminescence display (OLED: organic light emitting diode), an LED display, an LD display, a field emission display (FED), and a plasma display (PDP: plasma display panel). In addition, a solid state light source chip that has a plurality of light emitting points or that creates a plurality of light emitting points on a single substrate, a solid state light source chip array wherein a plurality of chips are arrayed, or the like may be used as the self luminous type image display device that constitutes the pattern forming apparatus, and the pattern may be formed by electrically controlling the solid state light source chip or chips. Furthermore, it does not matter whether the solid state light source device is inorganic or organic.

Each of the embodiments discussed above explains an exemplary case of an exposure apparatus that is provided with the projection optical system PL, but these can be adapted to an exposure apparatus and an exposing method that do not use the projection optical system PL. Thus, even if the projection optical system PL is not used, the exposure light is radiated onto the substrate through optical members, for example, lenses, and an immersion space is formed in a prescribed space between the substrate and those optical members.

In addition, by forming interference fringes on the substrate P as disclosed in, for example, PCT International Publication WO2001/035168, the exposure apparatus EX can also be adapted to an exposure apparatus (a lithographic system) that exposes the substrate P with a line-and-space pattern.

The exposure apparatus EX of the present embodiment is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 14:
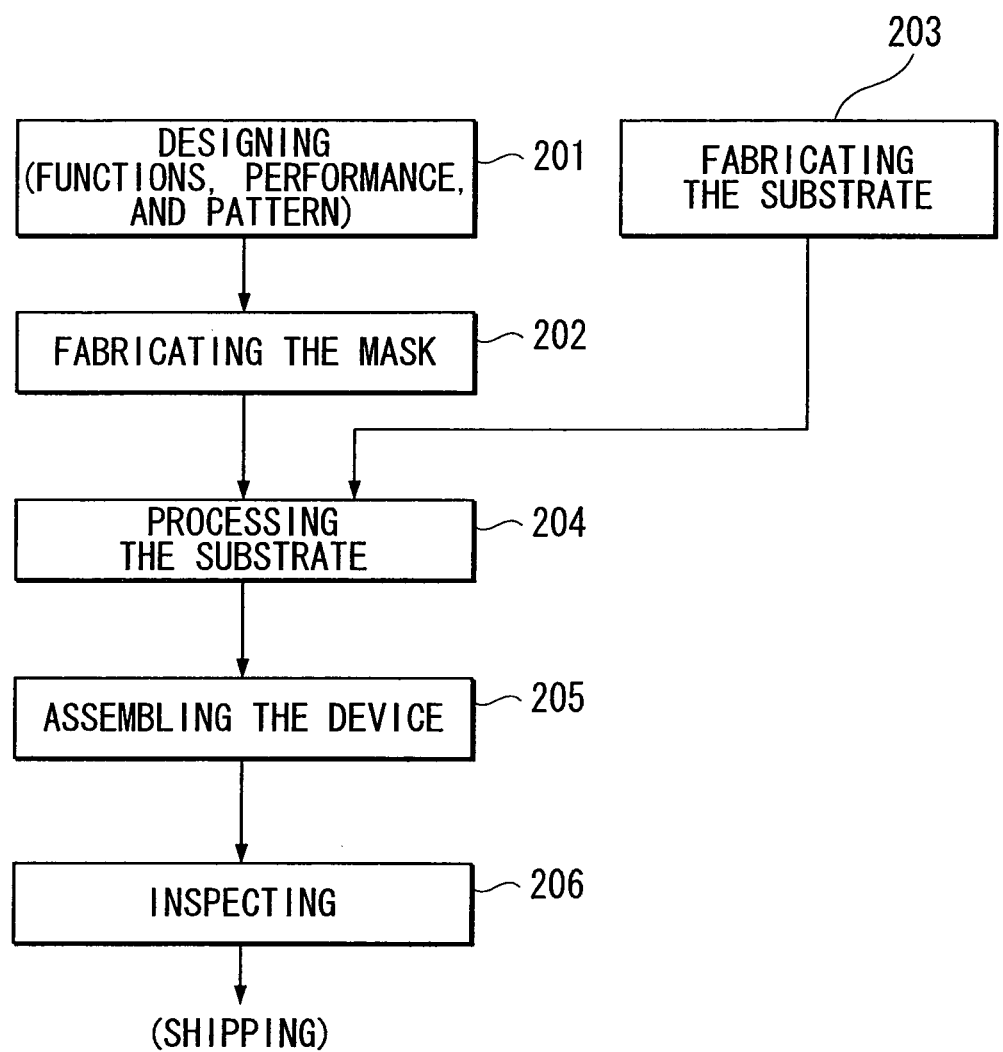
FIG. 14 is a flow chart that depicts one example of a process of fabricating a microdevice.

As shown in FIG. 14, a micro-device, such as a semiconductor device, is manufactured by: a step 201 that designs the functions and performance of the micro-device; a step 202 that fabricates a mask (a reticle) based on this designing step; a step 203 that fabricates a substrate, which is the base material of the device; a substrate processing step 204 that includes a substrate process (an exposure process) wherein, in accordance with the embodiments discussed above, the substrate is exposed with an image of the pattern of the mask and the exposed substrate is then developed; a device assembling step 205 (comprising fabrication processes such as a dicing process, a bonding process, and a packaging process); an inspecting step 206; and the like.

Furthermore, the above explains the embodiments of the present invention, but the present invention can be used by appropriately combining all of the constituent elements, and can also be used in cases wherein some of the constituent elements are not used.

As far as is permitted, the disclosures in all of the Patent Publications and U.S. patents related to exposure apparatuses and the like cited in the above respective embodiments and modified examples, are incorporated herein by reference.

What is claimed is:

1. A method of adjusting an immersion exposure apparatus that comprises a first holding part, which holds a substrate, and a second holding part, which holds the substrate before the substrate is held by the first holding part, the immersion exposure apparatus exposing the substrate, which is held by the first holding part, through a projection optical system and a liquid, the method comprising:

transferring a temperature detector to the second holding part;

detecting a second temperature with the temperature detector while holding the temperature detector with the second holding part;

transferring the temperature detector from the second holding part to the first holding part after the detection of the second temperature;

detecting a first temperature with the temperature detector while holding the temperature detector with the first holding part; and adjusting the temperature of at least one of the first holding part and the second holding part based on a detection result of the temperature detector.

2. An adjusting method according to claim 1, wherein the immersion exposure apparatus adjusts the temperature of the substrate, which is held by the second holding part, before the substrate is held by the first holding part.

3. An adjusting method according to claim 1, further comprising:
transporting the temperature detector from the second holding part to the first holding part.

4. The adjusting method according to claim 3, wherein the immersion exposure apparatus comprises a transport apparatus, which transports the substrate from the second holding part to the first holding part; and
the transport apparatus is used to transport the temperature detector from the second holding part to the first holding part.

5. An adjusting method according to claim 1, wherein the temperature of at least one of the first holding part and the second holding part is adjusted to minimize a temperature differential between the first holding part and the second holding part.

6. An adjusting method according to claim 1, wherein the temperature of at least one of the first holding part and the second holding part is adjusted to minimize a temperature differential between the first holding part and the substrate immediately before the substrate is held by the first holding part.

7. An adjusting method according to claim 1, further comprising:
supplying the liquid onto the temperature detector, which is held by the first holding part, after the temperature adjustment; and
adjusting the temperature of the liquid based on the detection result of the temperature detector related to temperature information about the liquid.

8. An adjusting method according to claim 7, wherein the temperature of the liquid is adjusted to minimize a temperature differential between the first holding part and the liquid.

9. An adjusting method according to claim 7, further comprising:
detecting a state of an image that is formed through the liquid after the temperature of the liquid is adjusted; and
performing an optical adjustment based on the detected image state.

10. An adjusting method according to claim 9, wherein the immersion exposure apparatus comprises the projection optical system; and
the optical adjustment comprises adjusting the projection optical system.

11. An adjusting method according to claim 1, wherein the adjustment of the temperature of at least one of the first holding part and the second holding part comprises adjusting a temperature distribution of at least one of the first holding part and the second holding part.

12. An adjusting method according to claim 1, wherein temperature information about the first holding part is acquired from the detection result of the temperature detector, which is held by the first holding part; and
temperature information about the second holding part is acquired from the detection result of the temperature detector, which is held by the second holding part.

13. An adjusting method according to claim 1, wherein the temperature detector has an external shape that is substantially the same as the external shape of the substrate.

14. A device fabricating method, comprising:
exposing the substrate using an immersion exposure apparatus that has been adjusted using the adjusting method according to claim 1; and
developing the exposed substrate.

15. An adjusting method according to claim 1, wherein the first holding part is capable of positioning at a position under the projection optical system and the second holding part is not capable of positioning at the position.

16. An adjusting method according to claim 1, further comprising:
adjusting a temperature of at least one of the first holding part and a movable member which is other than the first holding part and the second holding part and that moves under the projection optical system such that the temperature of the first holding part and a temperature of the movable member substantially coincide.

17. An adjusting method according to claim 16, wherein the movable member includes a measurement stage on which a measuring instrument that is capable of performing exposure-related measurements is mounted.

18. An adjusting method according to claim 1, wherein the temperature of the first holding part is adjusted based on the second temperature detected by the temperature detector.

19. An adjusting method according to claim 18, wherein the temperature of the first holding part is adjusted based on both the second temperature and the first temperature detected by the temperature detector.

20. An adjusting method according to claim 1, wherein the temperature of the second holding part is adjusted based on the first temperature detected by the temperature detector.

21. An adjusting method according to claim 20, wherein the temperature of the second holding part is adjusted based on both the first temperature and the second temperature detected by the temperature detector.

22. An exposure apparatus that exposes a substrate with exposure light through a projection optical system and a liquid, comprising:
a first holding part, which holds the substrate and is capable of positioning at a position at which the substrate is irradiated by the exposure light;
a second holding part, which holds the substrate before the substrate is held by the first holding part and adjusts a temperature of the substrate;
a transport apparatus, which transports a temperature detector held by the second holding part from the second holding part to the first holding part; and
an adjusting apparatus, which adjusts a temperature of at least one of the first holding part and the second holding part based on a detection result of the temperature detector,
wherein the temperature detector is transferred to the second holding part and a second temperature is detected while the temperature detector is held by the second holding part, and
wherein the temperature detector is transferred from the second holding part to the first holding part by the transport apparatus after the detection of the second temperature, and then a first temperature is detected while the temperature detector is held by the first holding part.

23. An exposure apparatus according to claim 22, wherein the transport apparatus is capable of transporting the substrate from the second holding part to the first holding part.

24. An exposure apparatus according to claim 22, further comprising:
a supply port through which the liquid is supplied to the temperature detector, which is held by the first holding part;
wherein,
the adjusting apparatus adjusts the temperature of the supplied liquid based on temperature information about the liquid acquired by the temperature detector.

25. An exposure apparatus according to claim 24, wherein the temperature of the liquid is adjusted to minimize a temperature differential between the first holding part and the liquid.

26. An exposure apparatus according to claim 22, further comprising:
an image detector that detects a state of an image that is formed through the liquid; and
an optical adjusting apparatus that performs an optical adjustment based on the detected image state;
wherein,
after the temperature of the liquid is adjusted, the image detector is used to detect the state of the image and the optical adjusting apparatus is used to perform the optical adjustment based on the detection result.

27. A device fabricating method, comprising:
exposing the substrate using an exposure apparatus according to claim 22; and
developing the exposed substrate.

28. An exposure apparatus according to claim 22, wherein the first holding part is capable of positioning at a position under the projection optical system and the second holding part is not capable of positioning at the position.

29. An exposure apparatus according to claim 22, further comprising:
a movable member which is other than the first holding part and the second holding part and that moves under the projection optical system,
wherein the adjusting apparatus adjusts a temperature of at least one of the first holding part and the movable member such that the temperature of the first holding part and a temperature of the movable member substantially coincide.

30. An exposure apparatus according to claim 29, wherein the movable member includes a measurement stage on which a measuring instrument that is capable of performing exposure-related measurements is mounted.

31. An exposure apparatus according to claim 22, wherein the temperature of the first holding part is adjusted based on the second temperature detected by the temperature detector.

32. An exposure apparatus according to claim 31, wherein the temperature of the first holding part is adjusted based on both the second temperature and the first temperature detected by the temperature detector.

33. An exposure apparatus according to claim 22, wherein the temperature of the second holding part is adjusted based on the first temperature detected by the temperature detector.

34. An exposure apparatus according to claim 33, wherein the temperature of the second holding part is adjusted based on both the first temperature and the second temperature detected by the temperature detector.

* * * * *